US012628380B2

(12) United States Patent
Park et al.

(10) Patent No.: US 12,628,380 B2
(45) Date of Patent: May 12, 2026

(54) THIN FILM TRANSISTOR AND DISPLAY APPARATUS COMPRISING THE SAME

(71) Applicant: LG Display Co., Ltd., Seoul (KR)

(72) Inventors: Jaeyoon Park, Paju-si (KR); Jinwon Jung, Paju-si (KR); Hyeonjoo Seul, Paju-si (KR); Sungju Choi, Paju-si (KR); Dongyeon Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 374 days.

(21) Appl. No.: 18/380,359

(22) Filed: Oct. 16, 2023

(65) Prior Publication Data

US 2024/0194791 A1     Jun. 13, 2024

(30) Foreign Application Priority Data

Dec. 9, 2022     (KR) ........................ 10-2022-0171711

(51) Int. Cl.
H01L 29/786     (2006.01)
G09G 3/32     (2016.01)
(Continued)

(52) U.S. Cl.
CPC ........... H10D 30/6755 (2025.01); G09G 3/32 (2013.01); H10D 30/6713 (2025.01);
(Continued)

(58) Field of Classification Search
CPC ........... H10D 30/6755; H10D 30/6757; H10D 30/6713; H10K 59/1213; G09G 3/32; G09G 2300/0842; G09G 2300/0861
See application file for complete search history.

(56) References Cited

U.S. PATENT DOCUMENTS 7,531,837 B2     5/2009  Liu
7,538,347 B2     5/2009  Takeguchi et al.
(Continued)

FOREIGN PATENT DOCUMENTS

JP          H11-40815 A     2/1999
JP          2007-5395 A     1/2007
(Continued)

OTHER PUBLICATIONS

The extended European search report issued in corresponding EP Patent Application No. 23192186.7 dated Feb. 22, 2024.
(Continued)

*Primary Examiner* — Peniel M Gumedzoe
(74) *Attorney, Agent, or Firm* — Morgan, Lewis & Bockius LLP

(57) ABSTRACT
A thin film transistor comprises an active layer; and a gate electrode spaced apart from the active layer to at least partially overlap the active layer in a plan view. The active layer includes a channel area that is overlapped by the gate electrode in the plan view; a source area connected to one side of the channel area without being overlapped by the gate electrode in the plan view; and a drain area connected to the other side of the channel area without being over-lapped by the gate electrode in the plan view. The source area and the drain area are spaced apart from each other with the channel area interposed therebetween. The active layer includes a first source conductorization control area and a first drain conductorization control area, which are spaced apart from each other. The first source conductorization control area corresponds to at least a portion of the channel area in the plan view, and the first drain conductorization control area corresponds to at least a portion of the channel area in the plan view.

36 Claims, 17 Drawing Sheets

(51) Int. Cl.
    *H10D 30/67*       (2025.01)
    *H10K 59/121*     (2023.01)

(52) U.S. Cl.
    CPC ..... *H10D 30/6757* (2025.01); *H10K 59/1213*
    (2023.02); *G09G 2300/0842* (2013.01); *G09G*
                          *2300/0861* (2013.01)

(56)              References Cited

U.S. PATENT DOCUMENTS

| | | | |
|---|---|---|---|
| 2004/0183132 A1 | 9/2004 | Yamazaki et al. | |
| 2006/0284550 A1* | 12/2006 | Takeguchi | H10D 30/6746 |
| | | | 257/E29.29 |
| 2012/0161125 A1* | 6/2012 | Yamazaki | H10D 99/00 |
| | | | 257/E21.409 |
| 2012/0305921 A1 | 12/2012 | Park et al. | |
| 2013/0043479 A1* | 2/2013 | Kim | H10D 30/674 |
| | | | 257/E21.414 |
| 2015/0069383 A1 | 3/2015 | Suzuki et al. | |
| 2016/0225912 A1 | 8/2016 | Cao et al. | |
| 2018/0212050 A1 | 7/2018 | Chung et al. | |

| | | | |
|---|---|---|---|
| 2019/0363194 A1 | 11/2019 | Shin et al. | |
| 2020/0105627 A1 | 4/2020 | Wang et al. | |
| 2022/0005838 A1* | 1/2022 | Yamanaka | H10D 30/6755 |
| 2022/0246767 A1 | 8/2022 | Murray et al. | |
| 2022/0320347 A1 | 10/2022 | Murray et al. | |

FOREIGN PATENT DOCUMENTS

| | | | |
|---|---|---|---|
| JP | 2009-016469 A | 1/2009 |
| JP | 2018-174339 A | 11/2018 |
| KR | 10-2016-0143788 A | 12/2016 |
| KR | 10-2018-0016330 A | 2/2018 |
| TW | 201943074 A | 11/2019 |
| TW | 202232767 A | 8/2022 |
| TW | 202238995 A | 10/2022 |

OTHER PUBLICATIONS

Office Action issued Nov. 13, 2024 for Japanese Patent Application No. 2023-179250.
Office Action issued in corresponding Taiwanese Patent Application No. 112135836, dated May 21, 2024.

* cited by examiner

<u>100</u>

135a  140  150  136a

130

120

110

II                                                    II'

<u>200</u>

135a  140  150  136a  <u>131</u>

131a 131b

120

110

THIN FILM TRANSISTOR AND DISPLAY APPARATUS COMPRISING THE SAME

CROSS-REFERENCE TO RELATED APPLICATIONS

This application claims the benefit of priority of the Korean Patent Application No. 10-2022-0171711 filed on Dec. 9, 2022, which is hereby incorporated by reference as if fully set forth herein.

BACKGROUND

Technical Field

The present disclosure relates to a thin film transistor and a display apparatus comprising the same.

Discussion of the Related Art

Transistors are widely used as switching devices or driving devices in the field of electronic apparatuses. In particular, since a thin film transistor can be manufactured on a glass substrate or a plastic substrate, the thin film transistor is widely used as a switching device of a display apparatus such as a liquid crystal display apparatus or an organic light emitting apparatus. Based on a material constituting the active layer, the thin film transistor may be categorized into an amorphous silicon thin film transistor in which amorphous silicon is used as an active layer, a polycrystalline silicon thin film transistor in which polycrystalline silicon is used as an active layer, and an oxide semiconductor thin film transistor in which oxide semiconductor is used as an active layer.

Because amorphous silicon may be deposited in a short time to form an active layer, an amorphous silicon thin film transistor (a-Si TFT) has advantages in that a manufacturing process time is short and a production cost is low. On the other hand, the amorphous silicon thin film transistor has a drawback in that it is restrictively used for an active matrix organic light emitting diode (AMOLED) because a current driving capacity is not good due to low mobility and there is a change in a threshold voltage.

A polycrystalline silicon thin film transistor (poly-Si TFT) is made by depositing amorphous silicon and crystallizing the deposited amorphous silicon. Because a process of manufacturing the polycrystalline silicon thin film transistor needs a step of crystallizing the amorphous silicon, a manufacturing cost is increased due to the increased number of the process steps. Because crystallization is performed at a high process temperature, it is difficult to apply the polycrystalline silicon thin film transistor to a large-sized display apparatus. Also, it is difficult to make sure of uniformity of the polycrystalline silicon thin film transistor due to polycrystalline characteristics.

An oxide constituting an active layer of an oxide semiconductor thin film transistor may be grown at a relatively low temperature, and the oxide semiconductor thin film transistor has high mobility, and has a large resistance change in accordance with an oxygen content, whereby desired properties may be easily obtained. Further, in view of the properties of the oxide and because an oxide semiconductor is transparent, the oxide semiconductor thin film transistor may be favorable in a transparent display.

In the case of the oxide semiconductor thin film transistor, selective conductorization for an oxide semiconductor layer may be required, and in this case, it is important to control a conductorization area formed in the oxide semiconductor layer and a conductorization permeation depth. Therefore, techniques for controlling the conductorization area and the conductorization permeation depth are being studied.

SUMMARY

Accordingly, embodiments of the present disclosure are directed to a thin film transistor and a display apparatus comprising the same that substantially obviate one or more of the problems due to limitations and disadvantages of the related art.

An aspect of the present disclosure is to provide a thin film transistor in which an active layer includes a pattern so that a conductorization permeation depth is controlled even though a channel area has a large width.

Another aspect of the present disclosure is to provide a thin film transistor in which an active layer includes a pattern so that a threshold voltage is prevented or suppressed from being shifted in a negative (−) direction even though a channel area has a large width.

Still another aspect of the present disclosure is to provide a thin film transistor in which an active layer includes a pattern to improve reliability.

Further still another aspect of the present disclosure is to provide a display apparatus comprising the above thin film transistor.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a thin film transistor comprises an active layer; and a gate electrode spaced apart from the active layer to at least partially overlap the active layer in a plan view, wherein the active layer includes: a channel area that is overlapped by the gate electrode in the plan view; a source area connected to one side of the channel area without being overlapped by the gate electrode in the plan view; and a drain area connected to the other side of the channel area without being overlapped by the gate electrode in the plan view, wherein the source area and the drain area are spaced apart from each other with the channel area interposed therebetween, wherein the active layer includes a first source conductorization control area and a first drain conductorization control area, which are spaced apart from each other, wherein the first source conductorization control area corresponds to at least a portion of the channel area in the plan view, and wherein the first drain conductorization control area corresponds to at least a portion of the channel area in the plan view.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
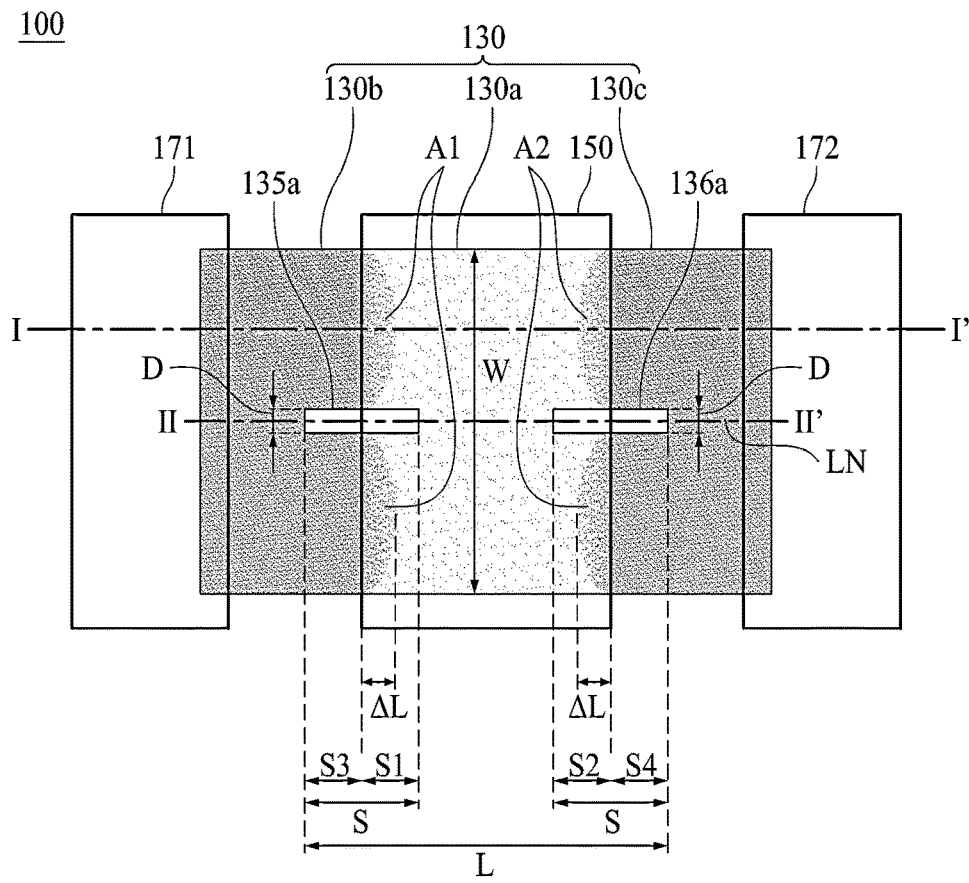
FIG. 1 is a plan view illustrating a thin film transistor according to one embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise,' 'have' and 'include' described in the present disclosure are used, another portion may be added unless 'only~' is used. The terms of a singular form may include plural forms unless referred to the contrary.

In construing an element, the element is construed as including an error band although there is no explicit description.

In describing a position relationship, for example, when the position relationship is described as 'upon~,' 'above~,' 'below~' and 'next to~,' one or more portions may be disposed between two other portions unless 'just' or 'direct' is used.

Spatially relative terms such as "below," "beneath," "lower," "above," and "upper" may be used herein to easily describe a relationship of one element or elements to another element or elements as illustrated in the drawings. It will be understood that these terms are intended to encompass different orientations of the device in addition to the orientation depicted in the drawings. For example, if the device illustrated in the figure is reversed, the device described to be arranged "below," or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent,"

"next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in a co-dependent relationship.

In the addition of reference numerals to the components of each drawing describing embodiments of the present disclosure, the same components can have the same sign as can be displayed on the other drawings.

In the embodiments of the present disclosure, a source electrode and a drain electrode are distinguished for convenience of description, and the source electrode and the drain electrode may be interchanged. The source electrode may be the drain electrode and vice versa. In addition, the source electrode of any one embodiment may be a drain electrode in another embodiment, and the drain electrode of any one embodiment may be a source electrode in another embodiment.

In some embodiments of the present disclosure, for convenience of description, a source area is distinguished from a source electrode, and a drain area is distinguished from a drain electrode, but embodiments of the present disclosure are not limited thereto. The source area may be the source electrode, and the drain area may be the drain electrode. In addition, the source area may be the drain electrode, and the drain area may be the source electrode.

Figure 2A:
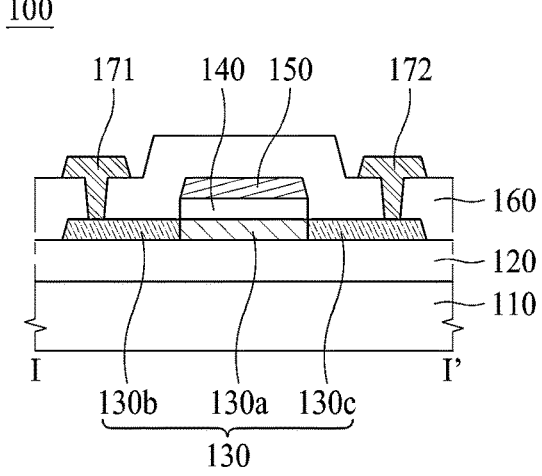
FIG. 2A is a cross-sectional view taken along line I-I' of FIG. 1.
Figure 2B:
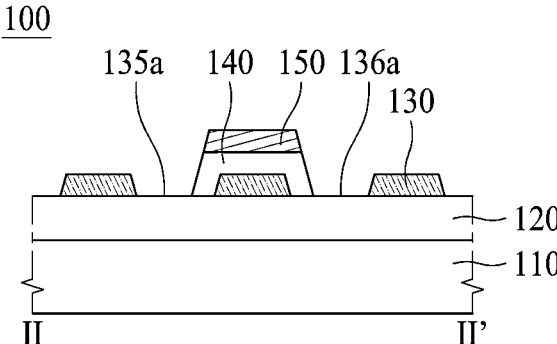
FIG. 2B is a cross-sectional view taken along line II-II' of FIG. 1.

FIG. 1 is a plan view illustrating a thin film transistor 100 according to one embodiment of the present disclosure. FIG. 2A is a cross-sectional view taken along line I-I' of FIG. 1. FIG. 2B is a cross-sectional view taken along line II-II' of FIG. 1.

With reference to FIGS. 1, 2A and 2B, the thin film transistor 100 according to one embodiment of the present disclosure may include an active layer 130 and a gate electrode 150. For example, referring to FIGS. 1, 2A and 2B, the thin film transistor 100 may include an active layer 130 and a gate electrode 150 spaced apart from the active layer 130 and at least partially overlapped with the active layer 130.

The thin film transistor 100 according to one embodiment of the present disclosure may further include a base substrate 110. Referring to FIGS. 2A and 2B, the active layer 130 is disposed on a base substrate 110.

The thin film transistor 100 according to one embodiment of the present disclosure may further include a buffer layer 120. In FIGS. 2A and 2B, the active layer 130 is disposed on the buffer layer 120. For example, the buffer layer 120 is disposed between the base substrate 110 and the active layer 130.

The thin film transistor 100 according to one embodiment of the present disclosure may further include a gate insulating layer 140. Referring to FIGS. 2A and 2B, the gate insulating layer 140 is disposed on the active layer 130. For example, the gate insulating layer 140 is disposed between the active layer 130 and the gate electrode 150.

The thin film transistor 100 according to one embodiment of the present disclosure may further include an interlayer insulating layer 160. In FIG. 2A, the interlayer insulating layer 160 is disposed on the gate electrode 150. For example, the gate electrode 150 is disposed between the gate insulating layer 140 and the interlayer insulating layer 160.

The thin film transistor 100 according to one embodiment of the present disclosure may further include a source electrode 171 and a drain electrode 172. Referring to FIG. 2A, the source electrode 171 and the drain electrode 172 are disposed on the interlayer insulating layer 160. For example, the interlayer insulating layer 160 is disposed between the gate electrode 150 and the source electrode 171 and the drain electrode 172.

Hereinafter, the elements of the thin film transistor 100 according to one embodiment of the present disclosure will be described in more detail.

Glass or plastic may be used as the base substrate 110. A transparent plastic having a flexible property, for example, polyimide may be used as the plastic.

When polyimide is used as the base substrate 110, a heat-resistant polyimide capable of enduring a high temperature may be used considering that a high temperature deposition process is performed on the base substrate 110. In this case, in order to form the thin film transistor, a process such as deposition, etching, etc. may be performed in a state that a polyimide substrate is disposed on a carrier substrate made of a high durability material such as glass.

Referring to FIGS. 2A and 2B, the buffer layer 120 may be disposed on the base substrate 110.

The buffer layer 120 is formed on the base substrate 110, and may be made of an inorganic material or an organic material. For example, the buffer layer 120 may include an insulating oxide such as silicon oxide (SiOx) and aluminum oxide ($Al_2O_3$).

The buffer layer 120 serves to protect the active layer 130 by blocking impurities such as moisture and oxygen introduced from the base substrate 110 and planarize an upper portion of the base substrate 110, may be formed of as a single layer or multiple layers.

Referring to FIGS. 2A and 2B, an active layer 130 may be disposed on the buffer layer 120.

The active layer 130 may include a channel area 130a, a source area 130b and a drain area 130c.

For example, the active layer 130 may include a channel area 130a that overlaps the gate electrode 150 on a plane, a source area 130b that does not overlap the gate electrode 150 on a plane and is connected to one side of the channel area 130a, and a drain area 130c that does not overlap the gate electrode 150 on a plane and is connected to the other side of the channel area 130a.

According to one embodiment of the present disclosure, the source area 130b and the drain area 130c are spaced apart from each other with the channel area 130a interposed therebetween.

According to one embodiment of the present disclosure, the active layer 130 may include a semiconductor material. The active layer 130 may include an oxide semiconductor material.

The oxide semiconductor material may include, for example, at least one of an IZO(InZnO)-based oxide semiconductor material, an IGO(InGaO)-based oxide semiconductor material, an ITO(InSnO)-based oxide semiconductor material, an IGZO(InGaZnO)-based oxide semiconductor material, an IGZTO(InGaZnSnO)-based oxide semiconductor material, a GZTO(GaZnSnO)-based oxide semiconductor material, a GZO(GaZnO)-based oxide semiconductor material, an ITZO(InSnZnO)-based oxide semiconductor material, or a FIZO(FeInZnO)-based oxide semiconductor material, but one embodiment of the present disclosure is not limited thereto. The active layer 130 may include another oxide semiconductor material known in the art.

The source area 130b and the drain area 130c may be formed by selective conductorization for the active layer 130 made of a semiconductor material. According to one embodiment of the present disclosure, conductivity being given to a specific portion of the active layer 130 to allow the specific portion to serve as a conductor will be referred to as selective conductorization.

For example, the active layer 130 may be selectively conductorized by ion doping. As a result, the source area 130b and the drain area 130c may be formed, but one embodiment of the present disclosure is not limited thereto. The active layer 130 may be selectively conductorized by another method known in the art.

The source area 130b and the drain area 130c do not overlap the gate electrode 150. The source area 130b and the drain area 130c have excellent electrical conductivity and high mobility as compared with the channel area 130a. Therefore, each of the source area 130b and the drain area 130c may serve as a line.

As shown in FIG. 1, the channel area 130a has a channel length L and a channel width W. The channel length L of the channel area 130a refers to a length in a direction of the source area 130b and the drain area 130c. In addition, the channel width W of the channel area 130a corresponds to a length perpendicular to the length of the channel area 130a.

According to one embodiment of the present disclosure, the active layer 130 may include a first source conductorization control area 135a and a first drain conductorization control area 136a. Also, the first source conductorization control area 135a and the first drain conductorization control area 136a are spaced apart from each other. For example, the first source conductorization control area 135a and the first drain conductorization control area 136a are spaced apart from each other with at least a portion of the channel area 130a interposed therebetween.

Referring to FIGS. 1 and 2B, the first source conductorization control area 135a may correspond to (for example but not limited to, be formed in, be defined in, or be disposed in) at least a portion of the channel area 130a. FIG. 1 illustrates a configuration in which the first source conductorization control area 135a corresponds to at least a portion of the channel area 130a, but one embodiment of the present disclosure is not limited thereto. The first source conductorization control area 135a may correspond to the channel area 130a and at the same time correspond to the source area 130b.

In addition, the first drain conductorization control area 136a may correspond to at least a portion of the channel area 130a. FIG. 1 illustrates a configuration in which a first drain conductorization control area 136a corresponds to at least a portion of a channel area 130a, but one embodiment of the present disclosure is not limited thereto. In FIG. 1, the first drain conductorization control area 136a may correspond to the channel area 130a and at the same time correspond to the drain area 130c.

According to one embodiment of the present disclosure, the first source conductorization control area 135a and the first drain conductorization control area 136a may be formed by patterning the active layer 130. For example, the first source conductorization control area 135a may be an area that corresponds to at least a portion of the channel area 130a and is surrounded by the active layer 130. For example, the first source conductorization control area 135a may be a portion in which the active layer 130 is partially patterned and then removed.

Also, the first drain conductorization control area 136a may be an area that corresponds to at least a portion of the channel area 130a and is surrounded by the active layer 130. For example, the first drain conductorization control area 136a may be a portion in which the active layer 130 is partially patterned and then removed.

Referring to FIG. 1, according to one embodiment of the present disclosure, the first source conductorization control area 135a and the first drain conductorization control area 136a have a width D and a length S, and in this case, the width D may be in the range of 0.5 μm to 5 μm.

With reference to FIG. 1, according to one embodiment of the present disclosure, when an area in which the first source conductorization control area 135a and the gate electrode 150 overlap each other has a length of S1, S1 may be in the range of 0.5 μm to 1.5 μm. This is the same even in case of the first drain conductorization control area 136a, and when the area in which the first drain conductorization control area 136a and the gate electrode 150 correspond to each other has a length of S2, S2 may be in the range of 0.5 μm to 1.5 μm.

According to one embodiment of the present disclosure, the first source conductorization control area 135a may correspond to the source area 130b. When an area in which the first source conductorization control area 135a and the source area 130b correspond to each other has a length of S3, S3 may be in the range of 0.5 μm to 5 μm. This is the same even in case of the first drain conductorization control area 136a, and when an area in which the first drain conductorization control area 136a and the drain area 130c correspond to each other has a length of S4, S4 may be in the range of 0.5 μm to 5 μm.

Figure 13:
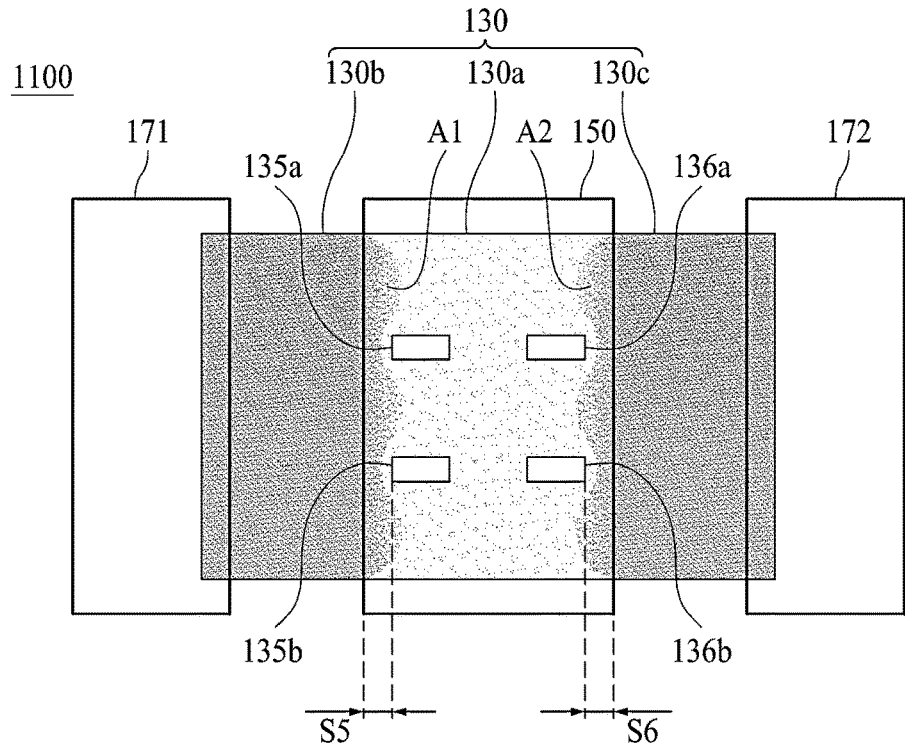
FIG. 13 is a plan view illustrating a thin film transistor according to further still another embodiment of the present disclosure.

In addition, referring to FIG. 13, according to one embodiment of the present disclosure, the first source conductorization control area 135a may not correspond to a boundary between the channel area 130a and the source area 130b. When the shortest distance between the first source conductorization control area 135a and the boundary between the channel area 130a and the source area 130b is S5, S5 may be in the range of 0.5 μm to 5 μm. This is the same even in case of the first drain conductorization control area 136a, and when the shortest distance between the first drain conductorization control area 136a and the boundary between the channel area 130a and the drain area 130c is S6, S6 may be in the range of 0.5 μm to 1.5 μm.

According to one embodiment of the present disclosure, the channel area 130a may be partially conductorized. For example, because the channel area 130a overlaps the gate electrode 150, the channel area 130a is not a directly conductorized in a conductorization process. However, the boundary between the channel area 130a and the source area 130b and the boundary between the channel area 130a and the drain area 130c may be partially conductorized due to diffusion of a dopant such as metal ions, diffusion of hydrogen and indirect influence of plasma in the conductorization process. Therefore, each of the boundary between the channel area 130a and the source area 130b and the boundary between the channel area 130a and the drain area 130c may have a carrier concentration gradient. The carrier concentration gradient will be described in detail with reference to FIGS. 17 and 18.

In general, when the channel area 130a of the active layer 130 has a large channel width W, conductorization diffusion may be performed in a boundary area between the channel area 130a and the source and drain areas 130b and 130c. When the conductorization diffusion is performed, a threshold voltage Vth of the thin film transistor 100 is shifted in a negative (−) direction, and thus driving stability of the thin film transistor 100 may be deteriorated.

When the channel area 130a of the active layer 130 has a small channel width W, conductorization diffusion may be reduced in the boundary area between the channel area 130a and the source and drain areas 130b and 130c. On the other hand, when the channel area 130a of the active layer 130 has a small channel width W, the total amount of carriers passing through the channel area 130a of the thin film transistor 100 may be reduced, and ON-current characteristics may be deteriorated. As a result, when a large amount of current flows in the thin film transistor 100 having a small channel width W in the channel area 130a, the thin film transistor 100 may be damaged so that driving stability of the thin film transistor 100 may be deteriorated. Therefore, the active layer 130 needs to control conductorization diffusion while having a large channel width W.

Figure 3:
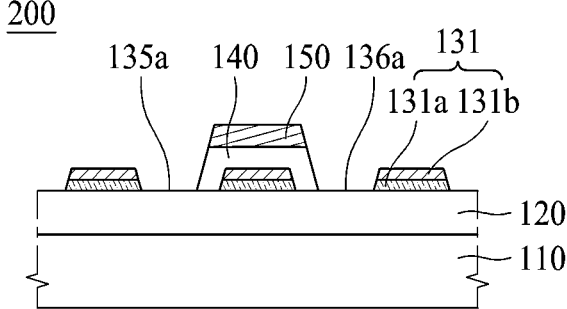
FIG. 3 is a cross-sectional view illustrating a thin film transistor according to another embodiment of the present disclosure.
Figure 4A:
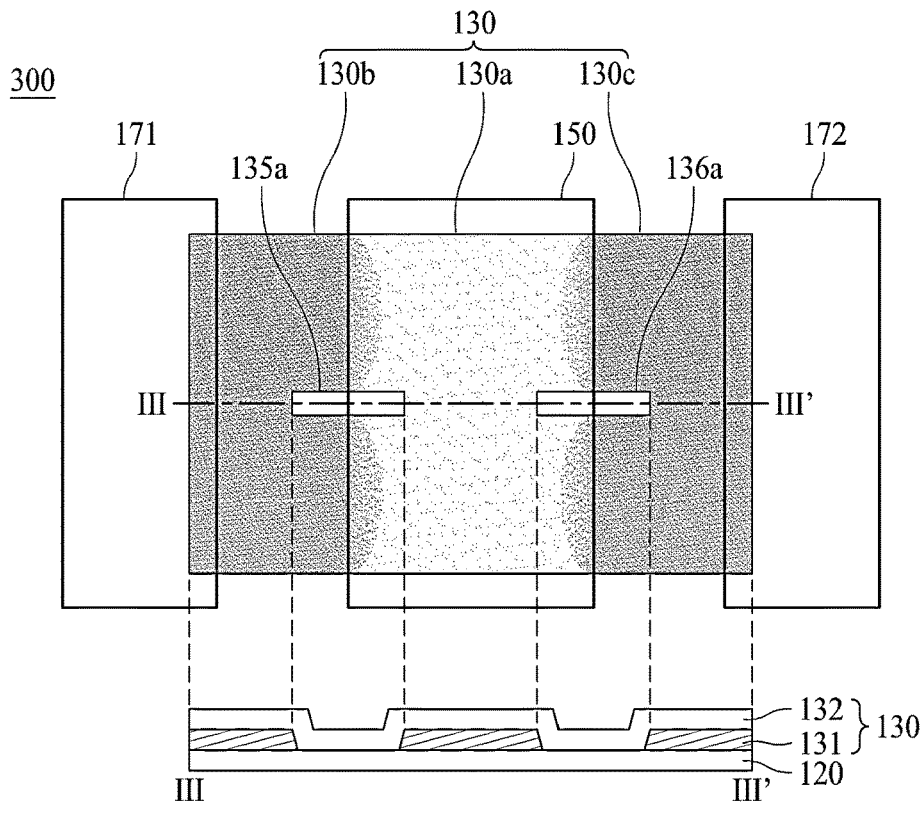
FIG. 4A is a plan view illustrating a thin film transistor according to still another embodiment of the present disclosure and a cross-sectional view taken along line III-III' of the plan view.
Figure 4B:
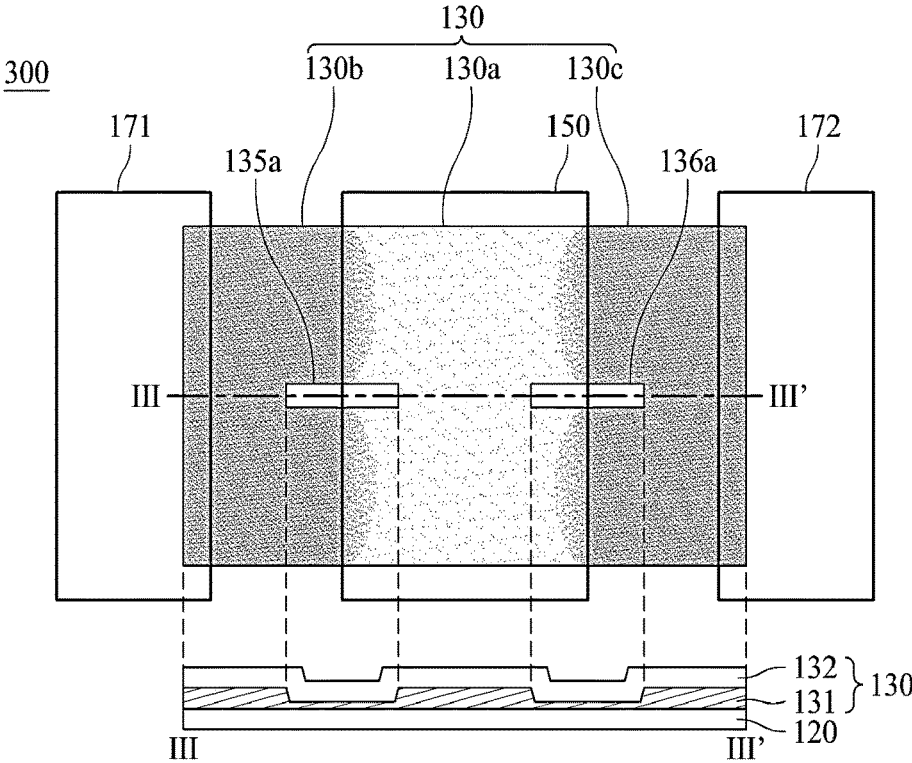
FIG. 4B is a plan view illustrating a thin film transistor according to further still another embodiment of the present disclosure and a cross-sectional view taken along line III-III' of the plan view.

Referring to FIGS. 3, 4A, and 4B, the first source conductorization control area 135a and the first drain conductorization control area 136a according to one embodiment of the present disclosure are formed by patterning the first active layer 131, and the first active layer 131 may not be stacked or its thickness may be small in the first source conductorization control area 135a and the first drain conductorization control area 136a. As a result, there is almost no concentration of a dopant in the first source conductorization control area 135a and the first drain conductorization control area 136a, or the concentration of the dopant may be low. Also, dopant diffusion may be avoided or suppressed in the periphery of the first source conductorization control area 135a and the first drain conductorization control area 136a. Therefore, the first source conductorization control area 135a and the first drain conductorization control area 136a may have the same function as that a plurality of channel areas 130a having a small channel width W are formed in the active layer 130, and may control conductorization permeation even though the channel area 130a has a large width.

Referring to FIG. 1, when the active layer 130 includes the first source conductorization control area 135a and the first drain conductorization control area 136a, conductorization may be suppressed on the first source conductorization control area 135a and the first drain conductorization control area 136a. Therefore, conductorization is performed in an area except the first source conductorization control area 135a and the first drain conductorization control area 136a of the channel area 130a of the active layer 130. As a result, even though the channel area 130a of the active layer 130 has a large channel width W, a width of the area in which conductorization is performed becomes narrow so that conductorization permeation into the channel area 130a may be avoided or controlled.

According to one embodiment of the present disclosure, the first drain conductorization control area 136a may be disposed on a first line LN that is the shortest line connecting the source area 130b with the drain area 130c across a first source conductorization control area 135a. For example, referring to FIG. 1, the first source conductorization control area 135a and the first drain conductorization control area 136a may be disposed on the first line LN, but one embodiment of the present disclosure is not limited thereto. The first drain conductorization control area 136a may not be disposed on the first line LN that is the shortest line connecting the source area 130b with the drain area 130c across the first source conductorization control area 135a.

According to one embodiment of the present disclosure, the active layer 130 may include a first active layer 131. For example, the first active layer 131 may be disposed on at least a portion of the channel area 130a, at least a portion of the source area 130b and at least a portion of the drain area 130c. In addition, the first active layer 131 may not be disposed in at least a portion of the first source conductorization control area 135a and the first drain conductorization control area 136a.

When the first active layer 131 is disposed in the first source conductorization control area 135a, a thickness of the first active layer 131 disposed in the first source conductorization control area 135a may be smaller than that of the first active layer 131 disposed in the channel area 130a except the first source conductorization control area 135a (see FIG. 4B).

Also, when the first active layer 131 is disposed in the first drain conductorization control area 136a, a thickness of the first active layer 131 disposed in the first drain conductorization control area 136a may be smaller than that of the first active layer 131 disposed in the channel area 130a except the first drain conductorization control area 136a (see FIG. 4B).

According to one embodiment of the present disclosure, the first source conductorization control area 135a may correspond to the boundary between the channel area 130a and the source area 130b and correspond to at least a portion of the source area 130b. In FIG. 1, the first source conductorization control area 135a corresponds to the boundary between the channel area 130a and the source area 130b and corresponds to source area 130b, but one embodiment of the present disclosure is not limited thereto. The first source conductorization control area 135a may correspond to the boundary between the channel area 130a and the source area 130b, and may not correspond to the source area 130b (see FIG. 9). In addition, the first source conductorization control area 135a may not correspond to the boundary between the channel area 130a and the source area 130b (see FIG. 13).

In addition, according to one embodiment of the present disclosure, the first drain conductorization control area 136a may correspond to the boundary between the channel area 130a and the drain area 130c and correspond to at least a portion of the drain area 130c. In FIG. 1, the first drain conductorization control area 136a corresponds to the boundary between the channel area 130a and the drain area 130c and corresponds to the drain area 130c, but one embodiment of the present disclosure is not limited thereto. The first drain conductorization control area 136a may correspond to the boundary between the channel area 130a and the drain area 130c and may not correspond to the drain area 130c (see FIG. 9). In addition, the first drain conductorization control area 136a may not correspond to the boundary between the channel area 130a and the drain area 130c (see FIG. 13).

Figure 9:
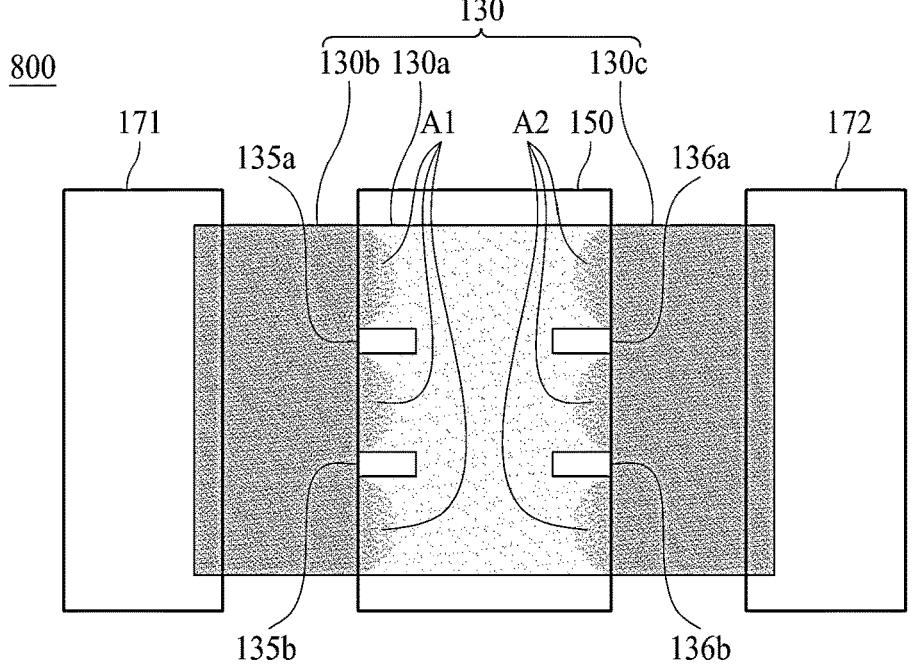
FIG. 9 is a plan view illustrating a thin film transistor according to further still another embodiment of the present disclosure.

Referring to FIG. 1 or 9, the channel area 130a may have a first diffusion area A1 and a second diffusion area A2. For example, according to one embodiment of the present disclosure, the first diffusion area A1 and the second diffusion area A2 are disposed to be spaced apart from each other.

According to one embodiment of the present disclosure, the first diffusion area A1 may be disposed on the channel area 130a, and may be in contact with the source area 130b. The second diffusion area A2 may be disposed on the channel area 130a, and may be in contact with the drain area 130c.

In more detail, the first diffusion area A1 and the second diffusion area A2 do not correspond to the first source conductorization control area 135a and the first drain conductorization control area 136a.

The first diffusion area A1 and the second diffusion area A2 are partially conductorized areas, and the first diffusion area A1 and the second diffusion area A2 mean areas that are partially conductorized in the channel area 130a. For example, the first diffusion area A1 and the second diffusion area A2 corresponds to the gate electrode 150, and thus are not directly conductorized in the conductorization process. However, the first diffusion area A1 and the second diffusion area A2 may be partially conductorized due to diffusion of a dopant, diffusion of hydrogen and indirect influence of plasma in the conductorization process. Therefore, each of the first diffusion area A1 and the second diffusion area A2 has a carrier concentration gradient. The carrier concentration gradient will be described in detail with reference to FIGS. 17 and 18.

Also, referring to FIG. 1, the first diffusion area A1 and the second diffusion area A2 are areas in which the channel area 130a is partially conductorized, and a length of an area in which the channel area 130a is conductorized, or a conductorized distance of the channel area 130a will be referred to as a conductorization permeation depth ΔL.

According to one embodiment of the present disclosure, when the length of the first diffusion area A1 and the second diffusion area A2 is referred to as the conductorization permeation depth ΔL, the conductorization permeation depth ΔL may be in the range of 0 μm to 1 μm. For example, the channel area 130a is partially conductorized during the selective conductorization process for the active layer 130, and the conductorized area does not serve as a channel. In FIG. 1, the conductorization permeation depth, which is the length of the first diffusion area A1 and the second diffusion area A2 in the channel area 130a, is represented by "ΔL." In addition, an area of the channel area 130a, which is capable of effectively serving as a channel without being conductorized, will be referred to as an effective channel. A length of the effective channel is shortened when the conductorization permeation depth ΔL is increased.

For the thin film transistor to perform a switching function, the length of the effective channel should be maintained to be equal to or greater than a predetermined value, and the conductorization permeation depth ΔL needs to be adjusted in order to make sure of a predetermined length of the effective channel. Therefore, the conductorization permeation depth ΔL needs to be in the range of 0 μm to 1 μm.

The gate insulating layer 140 may be disposed on the active layer 130. For example, referring to FIG. 2A, the gate insulating layer 140 is disposed between the active layer 130 and the gate electrode 150.

The gate insulating layer 140 may include at least one of silicon oxide, silicon nitride or metal oxide. The gate insulating layer 140 may have a single-layered structure or a multi-layered structure.

The gate electrode 150 may be disposed on the gate insulating layer 140. The gate electrode 150 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). Although not shown, the gate electrode 150 may have a multi-layered structure that includes two conductive layers having their respective physical properties different from each other. The gate electrode 150 serves as a hydrogen blocking layer for preventing hydrogen from being introduced from an upper portion of the gate electrode 150.

The thin film transistor 100 according to one embodiment of the present disclosure may further include an interlayer insulating layer 160. The interlayer insulating layer 160 is disposed on the gate electrode 150. The interlayer insulating layer 160 is an insulating layer made of an insulating material. The interlayer insulating layer 160 may be made of an organic material, may be made of an inorganic material, or may be made of a stacked body of an organic material layer and an inorganic material layer.

According to one embodiment of the present disclosure, the thin film transistor 100 may include a source electrode 171 and a drain electrode 172. For example, as shown in FIG. 2A, the source electrode 171 and the drain electrode 172 may be disposed on the interlayer insulating layer 160.

The source electrode 171 and the drain electrode 172 may be spaced apart from each other and respectively connected to the active layer 130. Referring to FIG. 2A, each of the source electrode 171 and the drain electrode 172 may be connected to the active layer 130 through a contact hole. In more detail, each of the source electrode 171 and the drain electrode 172 may be connected to the source area 130b and the drain area 130c of the active layer 130 through a contact hole.

Each of the source electrode 171 and the drain electrode 172 may include at least one of molybdenum (Mo), aluminum (Al), chromium (Cr), gold (Au), titanium (Ti), nickel (Ni), neodymium (Nd), copper (Cu) or their alloy.

In one embodiment and the drawings of the present disclosure, the source electrode 171 and the drain electrode 172 are only distinguished for convenience of description, and the source electrode 171 and the drain electrode 172 are not limited by the drawings and the aforementioned descriptions. The source electrode 171 and the drain electrode 172 may be interchanged. The source area 130b and the drain area 130c are also distinguished for convenience of description, and the source area 130b and the drain area 130c may be interchanged.

FIG. 3 is a cross-sectional view illustrating a thin film transistor 200 according to another embodiment of the present disclosure.

According to one embodiment of the present disclosure, the first active layer 131 may further include a first oxide semiconductor layer 131a and a second oxide semiconductor layer 131b. In FIG. 3, the second oxide semiconductor layer 131b may be disposed on the first oxide semiconductor layer 131a.

FIG. 4A is a plan view illustrating a thin film transistor 300 according to still another embodiment of the present disclosure and a cross-sectional view taken along line III-III' of the plan view, and FIG. 4B is a plan view illustrating a thin film transistor according to further still another embodiment of the present disclosure and a cross-sectional view taken along line III-III' of the plan view.

Referring to FIG. 4A, as compared with FIG. 1, according to one embodiment of the present disclosure, the active layer 130 may further include a first active layer 131 and a second active layer 132 on the first active layer 131.

According to one embodiment of the present disclosure, the second active layer 132 may be formed by a semiconductor material. The second active layer 132 may include an oxide semiconductor material.

The second active layer 132 may be made of the same oxide semiconductor material as that of the first active layer 131, or may be made of an oxide semiconductor material different from that of the first active layer 131.

According to one embodiment of the present disclosure, the second active layer 132 may be disposed in the entire channel area 130a, the entire source area 130b and the entire drain area 130c. For example, the second active layer 132 may be disposed in the first source conductorization control area 135a and the first drain conductorization control area 136a. In FIG. 4, the second active layer 132 is disposed in the first source conductorization control area 135a and the first drain conductorization control area 136a. In more detail, at least a portion of the second active layer 132 may be in contact with a side of the first active layer 131 in the first source conductorization control area 135a and the first drain conductorization control area 136a.

In more detail, in FIG. 4A, the first active layer 131 is not disposed in at least a portion of the first source conductorization control area 135a and the first drain conductorization control area 136a and the second active layer 132 is disposed in the first source conductorization control area 135a and the first drain conductorization control area 136a. Further, referring to FIG. 4A, the second active layer 132 may be in contact with the buffer layer 120 in the first source conductorization control area 135a and the first drain conductorization control area 136a.

On the other hand, in FIG. 4B as compared with FIG. 4A, the first active layer 131 is disposed in the first source conductorization control area 135a. For example, when the first active layer 131 is disposed in the first source conductorization control area 135a, the thickness of the first active layer 131 disposed in the first source conductorization control area 135a may be smaller than that of the first active layer 131 disposed in the channel area 130a except the first source conductorization control area 135a. In this case, the second active layer 132 is not in contact with the buffer layer 120 in the first source conductorization control area 135a.

Also, the first active layer 131 may be disposed in the first drain conductorization control area 136a. For example, when the first active layer 131 is disposed in the first drain conductorization control area 136a, the thickness of the first active layer 131 disposed in the first drain conductorization control area 136a may be smaller than that of the first active layer 131 disposed in the channel area 130a except the first drain conductorization control area 136a. In this case, the second active layer 132 is not in contact with the buffer layer 120 in the first drain conductorization control area 136a.

According to one embodiment of the present disclosure, even though the active layer 130 has a multi-layered structure, the first source conductorization control area 135a and the first drain conductorization control area 136a are smaller in thickness than the area of the active layer 130 except the first source conductorization control area 135a and the first drain conductorization control area 136a, whereby the conductorization permeation depth $\Delta L$ to the channel area 130a may be controlled.

Figure 5:
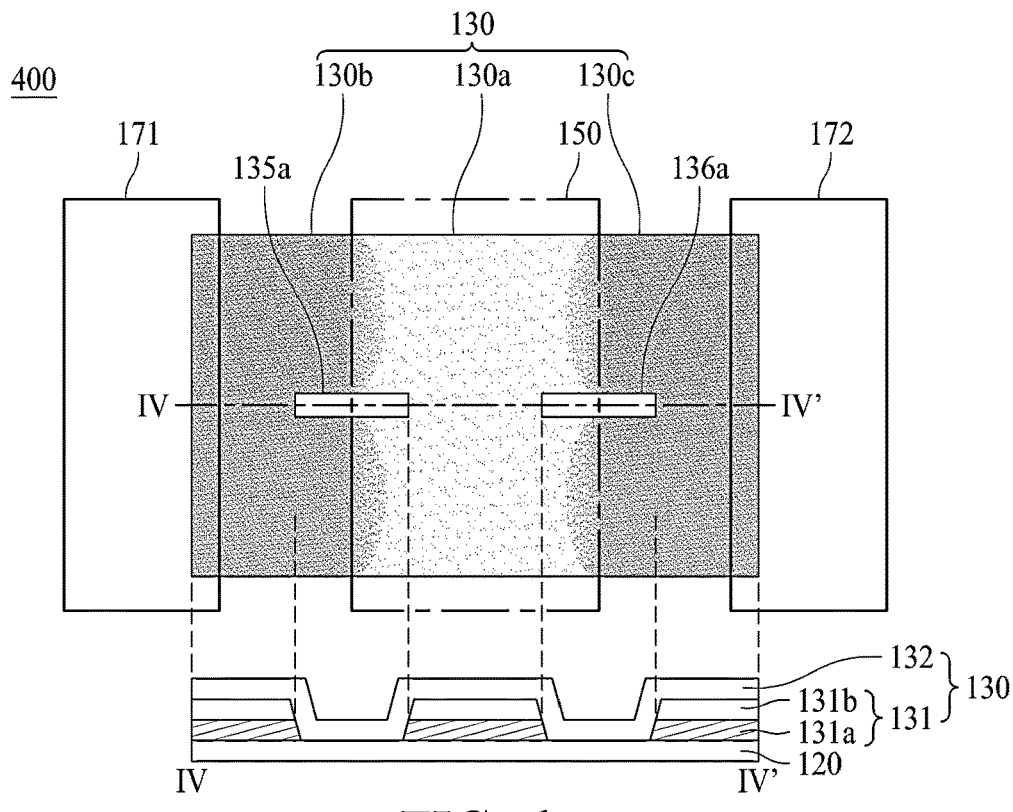
FIG. 5 is a plan view illustrating a thin film transistor according to further still another embodiment of the present disclosure and a cross-sectional view taken along line IV-IV' of the plan view.

FIG. 5 is a plan view illustrating a thin film transistor 400 according to further still another embodiment of the present disclosure and a cross-sectional view taken along line IV-IV' of the plan view.

In FIG. 5 as compared with FIG. 4, the first active layer 131 may include a first oxide semiconductor layer 131a and a second oxide semiconductor layer 131b. Referring to FIG. 5, the first active layer 131 may include a first oxide semiconductor layer 131a and a second oxide semiconductor layer 131b on the first oxide semiconductor layer 131a. For example, the first active layer 131 may be patterned to form the first source conductorization control area 135a and the first drain conductorization control area 136a, and the second active layer 132 may be disposed in the entire channel area 130a, the entire source area 130b and the entire drain area 130c. In more detail, the second active layer 132 may be disposed in the first source conductorization control area 135a and the first drain conductorization control area 136a. At least a portion of the second active layer 132 may be in contact with any one of the first oxide semiconductor layer 131a and the second oxide semiconductor layer 131b in the first source conductorization control area 135a and the first drain conductorization control area 136a.

Figure 6:
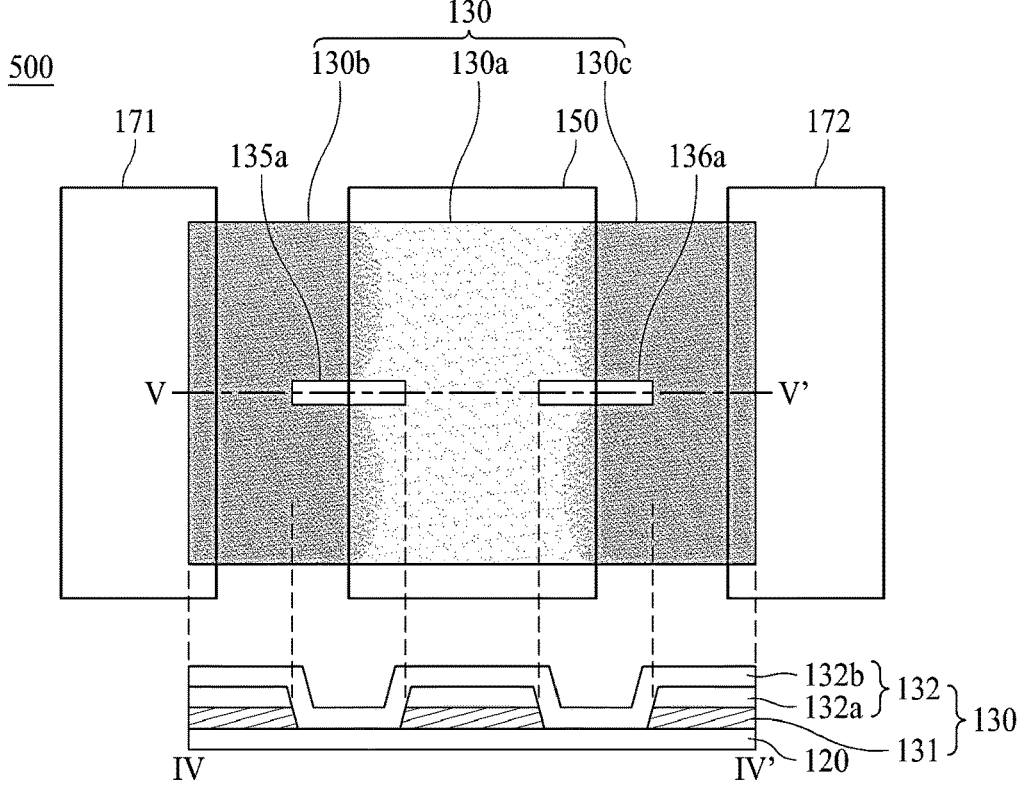
FIG. 6 is a plan view illustrating a thin film transistor according to further still another embodiment of the present disclosure and a cross-sectional view taken along line V-V' of the plan view.

FIG. 6 is a plan view illustrating a thin film transistor 500 according to further still another embodiment of the present disclosure and a cross-sectional view taken along line V-V' of the plan view.

In FIG. 6 as compared with FIG. 4, the second active layer 132 may include a third oxide semiconductor layer 132a and a fourth oxide semiconductor layer 132b. Referring to FIG. 6, the second active layer 132 may include a third oxide semiconductor layer 132a and a fourth oxide semiconductor layer 132b on the third oxide semiconductor layer 132a. For example, the first active layer 131 may be patterned to form the first source conductorization control area 135a and the first drain conductorization control area 136a, and the second active layer 132 may be disposed in the entire channel area 130a, the entire source area 130b and the entire drain area 130c. In more detail, at least a portion of the first active layer 131 may be in contact with at least a portion of the third oxide semiconductor layer 132a in the first source conductorization control area 135a and the first drain conductorization control area 136a.

Figure 7:
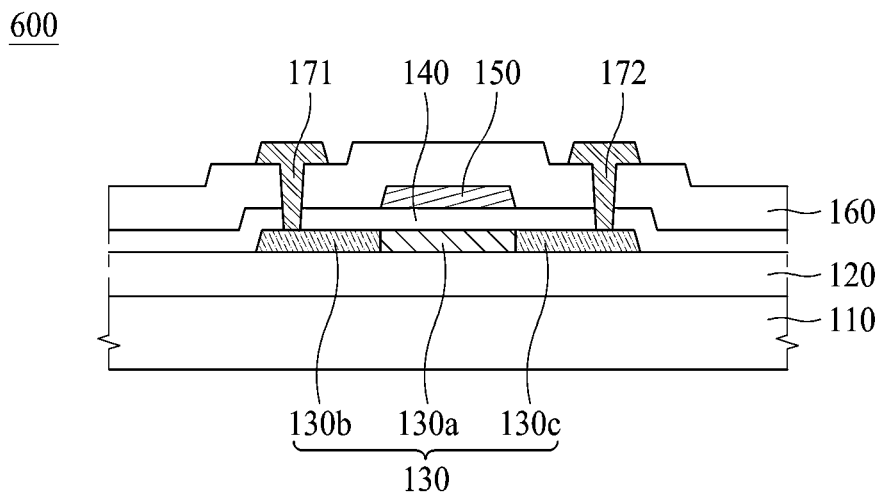
FIG. 7 is a cross-sectional view illustrating a thin film transistor according to further still another embodiment of the present disclosure.

FIG. 7 is a cross-sectional view illustrating a thin film transistor 600 according to further still another embodiment of the present disclosure.

Referring to FIG. 7, according to one embodiment of the present disclosure, the gate insulating layer 140 may cover an upper surface of the channel area 130a of the active layer 130, and may be patterned in various forms exposing upper surfaces of the source area 130b and the drain area 130c. In FIG. 7, the gate insulating layer 140 covers an entire upper surface of the active layer 130 but one embodiment of the present disclosure is not limited thereto. The gate insulating layer 140 may expose the upper surfaces of the source area 130b and the drain area 130c (see FIG. 2A).

Figure 8:
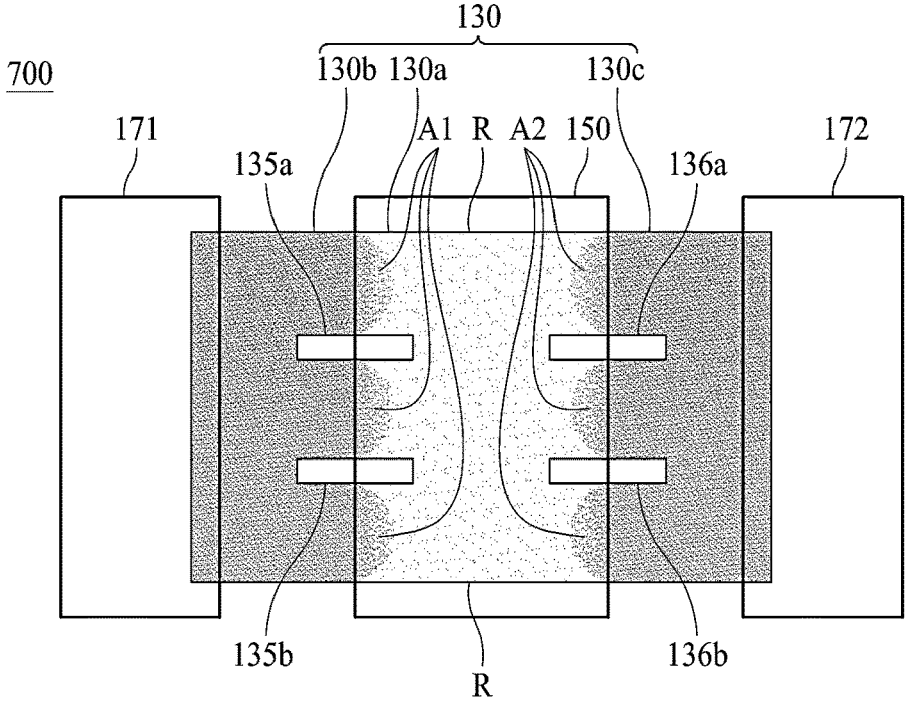
FIG. 8 is a plan view illustrating a thin film transistor according to further still another embodiment of the present disclosure.

FIG. 8 is a plan view illustrating a thin film transistor 700 according to further still another embodiment of the present disclosure.

In FIG. 8 as compared with FIG. 1, the active layer 130 further includes a second source conductorization control area 135b and a second drain conductorization control area 136b.

According to one embodiment of the present disclosure, the active layer 130 includes a second source conductorization control area 135b and a second drain conductorization control area 136b, which are spaced apart from each other, and the second source conductorization control area 135*b* may correspond to at least a portion of the channel area 130*a*. The second drain conductorization control area 136*b* may correspond to at least a portion of the channel area 130*a*.

FIG. 8 illustrates that the first source conductorization control area 135*a*, the second source conductorization control area 135*b*, the first drain conductorization control area 136*a* and the second drain conductorization control area 136*b* have the same size, but one embodiment of the present disclosure is not limited thereto. The first source conductorization control area 135*a*, the second source conductorization control area 135*b*, the first drain conductorization control area 136*a* and the second drain conductorization control area 136*b* may not have the same size.

FIG. 8 illustrates that the first source conductorization control area 135*a* is disposed on an upper portion of the second source conductorization control area 135*b* on a plane, but one embodiment of the present disclosure is not limited thereto, and the positions of the first source conductorization control area 135*a* and the second source conductorization control area 135*b* may be changed. This is equally applied to the first drain conductorization control area 136*a* and the second drain conductorization control area 136*b*.

The second source conductorization control area 135*b* may correspond to the boundary between the channel area 130*a* and the source area 130*b* and correspond to at least a portion of the source area 130*b*. In FIG. 8, the second source conductorization control area 135*b* corresponds to the boundary between the channel area 130*a* and the source area 130*b* and corresponds to at least a portion of the source area 130*b*, but one embodiment of the present disclosure is not limited thereto. The second source conductorization control area 135*b* may not correspond to the source area 130*b* or may not correspond to the boundary between the channel area 130*a* and the source area 130*b*.

The second drain conductorization control area 136*b* may correspond to the boundary between the channel area 130*a* and the drain area 130*c* and may correspond to at least a portion of the drain area 130*c*. In FIG. 8, the second drain conductorization control area 136*b* corresponds to the boundary between the channel area 130*a* and the drain area 130*c* and corresponds to at least a portion of the drain area 130*c*, but one embodiment of the present disclosure is not limited thereto. The second drain conductorization control area 136*b* may not correspond to the drain area 130*b* or may not correspond to the boundary between the channel area 130*a* and the drain area 130*c*.

With reference to FIG. 8, the first diffusion area A1 may be disposed between the first source conductorization control area 135*a* and the second source conductorization control area 135*b*. In this case, the first diffusion area A1 does not correspond to the first source conductorization control area 135*a* and the second source conductorization control area 135*b*.

With reference to FIG. 8, the second diffusion area A2 may be disposed between the first drain conductorization control area 136*a* and the second drain conductorization control area 136*b*. In this case, the second diffusion area A2 does not correspond to the first drain conductorization control area 136*a* and the second drain conductorization control area 136*b*.

According to one embodiment of the present disclosure, when the active layer 130 includes the second source conductorization control area 135*b*, the first source conductorization control area 135*a* and the second source conductorization control area 135*b* are spaced apart from each other. When the first source conductorization control area 135*a* and the second source conductorization control area 135*b* are spaced apart from each other, the first diffusion area A1 may be disposed between the first source conductorization control area 135*a* and the second source conductorization control area 135*b*.

When the active layer 130 includes the first drain conductorization control area 136*a* and the second drain conductorization control area 136*b*, the first drain conductorization control area 136*a* and the second drain conductorization control area 136*b* are spaced apart from each other. When the first drain conductorization control area 136*a* and the second drain conductorization control area 136*b* are spaced apart from each other, the second diffusion area A2 may be disposed between the first drain conductorization control area 136*a* and the second drain conductorization control area 136*b*.

According to one embodiment of the present disclosure, the first source conductorization control area 135*a* and the second source conductorization control area 135*b* may be disposed at intervals of 0.5 μm to 20 μm.

Also, the first drain conductorization control area 136*a* and the second drain conductorization control area 136*b* may be disposed at intervals of 0.5 μm to 20 μm. At this time, the interval between the first source conductorization control area 135*a* and the second source conductorization control area 135*b* and the interval between the first drain conductorization control area 136*a* and the second drain conductorization control area 136*b* may be the same as or different from each other.

When the interval between the first source conductorization control area 135*a* and the second source conductorization control area 135*b* is greater than 20 μm, a width of an area of the channel area 130*a*, in which conductorization is performed, becomes wider so that conductorization cannot be avoided or controlled in the channel area 130*a*. As a result, the conductorization permeation depth ΔL of the diffusion areas A1 and A2 becomes longer and has a relatively short effective channel length. In addition, a threshold voltage Vth of the thin film transistor is shifted in a negative (−) direction so that driving stability of the thin film transistor may be deteriorated. This is the same even when the interval between the first drain conductorization control area 136*a* and the second drain conductorization control area 136*b* is greater than 20 μm.

When the interval between the first source conductorization control area 135*a* and the second source conductorization control area 135*b* is in the range of 0.5 μm to 20 μm, the width of the area of the channel area 130*a*, in which conductorization is performed, becomes narrow, so that conductorization may be avoided or controlled in the channel area 130*a*. On the other hand, when the interval between the first source conductorization control area 135*a* and the second source conductorization control area 135*b* is less than 0.5 μm, the width of the area in which conductorization is performed is too narrow, the total amount of the carrier passing through the channel area 130*a* of the thin film transistor 100 may be reduced, and ON-current may be suppressed. As a result, when a large amount of current flows in the thin film transistor 100 having a small width in an area in which conductorization is performed, the thin film transistor 100 may be damaged so that driving stability of the thin film transistor 100 may be deteriorated. This is the same even when the interval between the first drain conductorization control area 136*a* and the second drain conductorization control area 136*b* is less than 0.5 μm.

According to one embodiment of the present disclosure, the active layer 130 may further include a third source conductorization control area and a third drain conductorization control area. Although FIG. 8 illustrates only the first source conductorization control area 135a, the second source conductorization control area 135b, the first drain conductorization control area 136a and the second drain conductorization control area 136b, one embodiment of the present disclosure is not limited thereto. Although not shown, three or more source grooves and three or more drain grooves may be provided.

FIG. 9 is a plan view illustrating a thin film transistor 800 according to further still another embodiment of the present disclosure.

In FIG. 9 as compared with FIG. 8, the first source conductorization control area 135a and the second source conductorization control area 135b correspond to the boundary between the channel area 130a and the source area 130b, and may not corresponds to the source area 130b. In addition, the first drain conductorization control area 136a and the second drain conductorization control area 136b may correspond to the boundary between the channel area 130a and the drain area 130c, and may not correspond to the drain area 130c.

According to one embodiment of the present disclosure, even though each of the first source conductorization control area 135a, the second source conductorization control area 135b, the first drain conductorization control area 136a and the second drain conductorization control area 136b does not correspond to the source area 130b and the drain area 130c, conductorization diffusion into the channel area 130a may be avoided or controlled.

Figure 10:
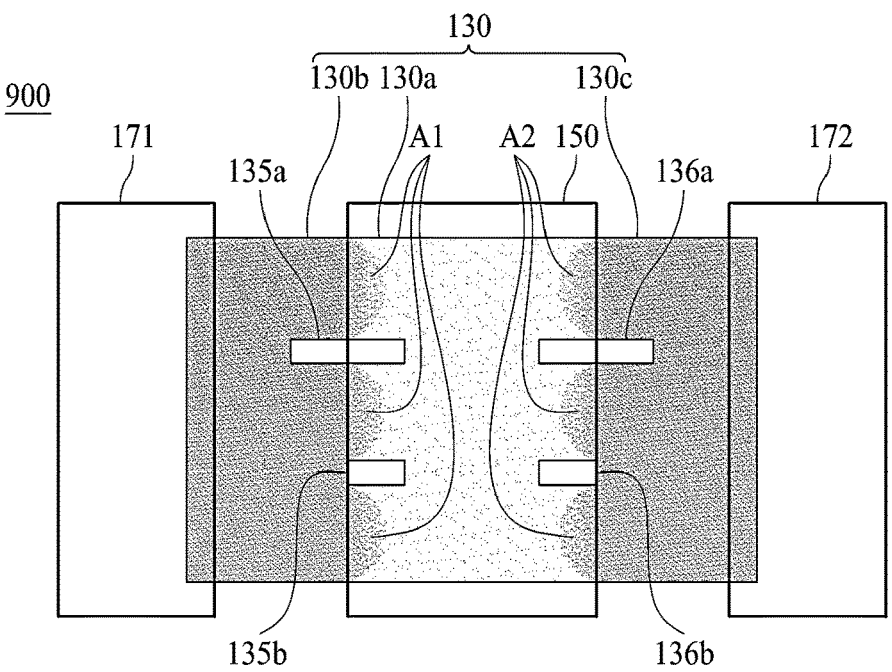
FIG. 10 is a plan view illustrating a thin film transistor according to further still another embodiment of the present disclosure.

FIG. 10 is a plan view illustrating a thin film transistor 900 according to further still another embodiment of the present disclosure.

In FIG. 10 as compared with FIG. 9, at least one of the first source conductorization control area 135a or the second source conductorization control area 135b may correspond to the source area 130b.

In FIG. 10, the first source conductorization control area 135a corresponds to the source area 130b and the second source conductorization control area 135b does not correspond to the source area 130b, but one embodiment of the present disclosure is not limited thereto. The first source conductorization control area 135a may not correspond to the source area 130b, and the second source conductorization control area 135b may correspond to the source area 130b.

According to one embodiment of the present disclosure, at least one of the first drain conductorization control area 136a or the second drain conductorization control area 136b may correspond to the drain area 130c. In FIG. 10, the first drain conductorization control area 136a corresponds to the drain area 130c and the second drain conductorization control area 136b does not correspond to the drain area 130c, but one embodiment of the present disclosure is not limited thereto. The first drain conductorization control area 136a may not correspond to the drain area 130c, and the second drain conductorization control area 136b may correspond to the drain area 130c.

Figure 11A:
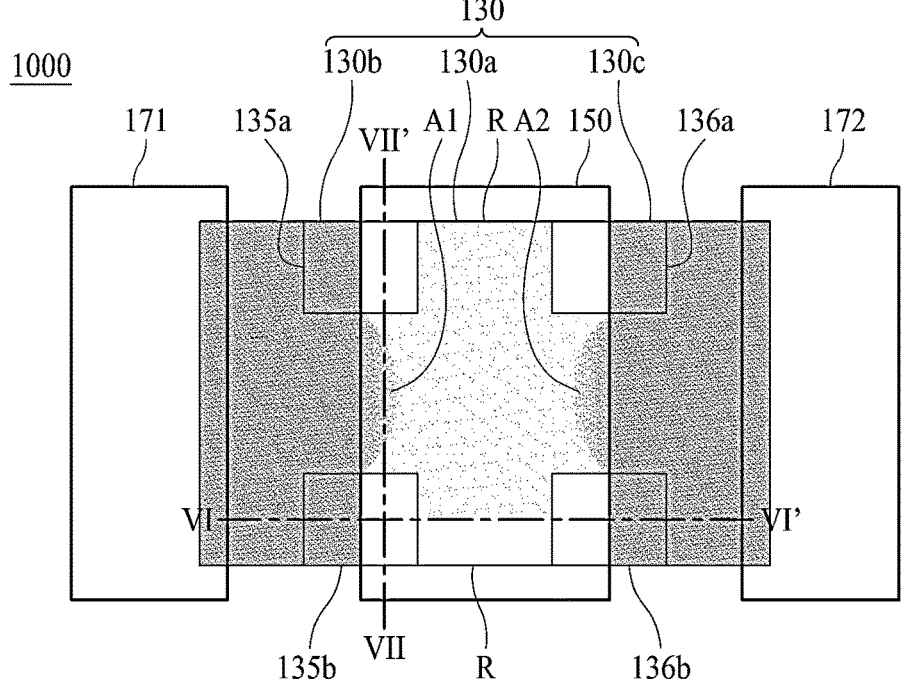
FIG. 11A is a plan view illustrating a thin film transistor according to further still another embodiment of the present disclosure.

FIG. 11A is a plan view illustrating a thin film transistor according to further still another embodiment of the present disclosure.

Figure 11B:
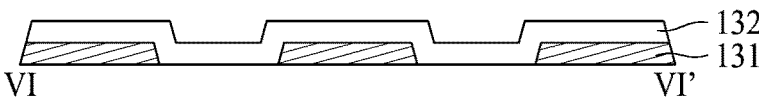
FIG. 11B is a cross-sectional view taken along line VI-VI' of FIG. 11A.

FIG. 11B is a cross-sectional view taken along line VI-VI' of FIG. 11A.

Figure 11C:
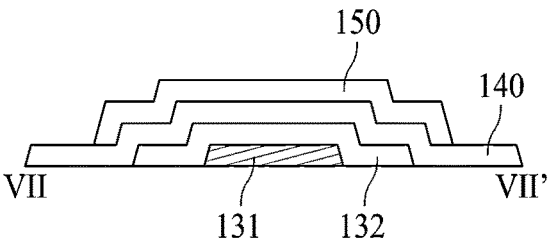
FIG. 11C is a cross-sectional view taken along line VII-VII' of FIG. 11A.

FIG. 11C is a cross-sectional view taken along the line VII-VII' of FIG. 11A.

According to one embodiment of the present disclosure, the first source conductorization control area 135a corresponds to an edge R in a length direction of the channel area 130a, and in this case, the length direction of the channel area 130a is a direction connecting the source area 130b with the drain area 130c.

Referring to FIGS. 11A, 11B and 11C, the active layer 130 of the thin film transistor 1000 includes a first active layer 131 and a second active layer 132.

For example, the active layer 130 includes a first source conductorization control area 135a and a second source conductorization control area 135b, and the first source conductorization control area 135a and the second source conductorization control area 135b correspond to the edge R in the length direction of the channel area 130a. In more detail, referring to FIG. 8, the first source conductorization control area 135a and the second source conductorization control area 135b do not correspond to the edge R in the length direction of the channel area 130a. For example, in FIG. 8, the first source conductorization control area 135a and the second source conductorization control area 135b are disposed to be spaced apart from the edge R in the length direction of the channel area 130a.

According to one embodiment of the present disclosure, the first drain conductorization control area 136a may correspond to the edge R in the length direction of the channel area 130a.

Referring to FIGS. 11A, 11B and 11C, the active layer 130 includes a first drain conductorization control area 136a and a second drain conductorization control area 136b, and the first drain conductorization control area 136a and the second drain conductorization control area 136b correspond to the edge R in the length direction of the channel area 130a. Redundant descriptions of the first source conductorization control area 135a and the second source conductorization control area 135b will be omitted.

In FIGS. 11B and 11C, the active layer includes a first active layer 131 and a second active layer 132, but one embodiment of the present disclosure is not limited thereto. The active layer may not include the second active layer 132.

Figure 12A:
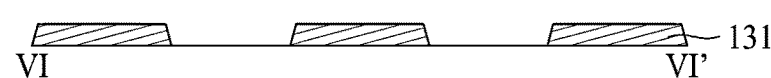
FIG. 12A is a cross-sectional view taken along line VI-VI' of a thin film transistor according to another embodiment of FIG. 11A.
Figure 12B:
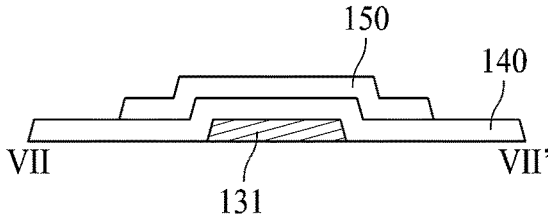
FIG. 12B is a cross-sectional view taken along line VII-VII' of a thin film transistor according to another embodiment of FIG. 11A.

FIG. 12A is a cross-sectional view taken along line VI-VI' of a thin film transistor according to another embodiment of FIG. 11A. FIG. 12B is a cross-sectional view taken along line VII-VII' of the thin film transistor according to another embodiment of FIG. 11A. In FIGS. 12A and 12B as compared with FIGS. 11B and 11C, the active layer does not include the second active layer 132. FIG. 13 is a plan view of a thin film transistor 1100 according to further still another embodiment of the present disclosure.

According to one embodiment of the present disclosure, the first source conductorization control area 135a may not correspond to the boundary between the channel area 130a and the source area 130b. The first drain conductorization control area 136a may not correspond to the boundary between the channel area 130a and the drain area 130c.

In FIG. 13 as compared with FIG. 8, the first source conductorization control area 135a and the second source conductorization control area 135b may not correspond to the source area 130b, and may not correspond to the boundary between the source area 130b and the channel area 130a.

According to one embodiment of the present disclosure, even when the first source conductorization control area 135a and the second source conductorization control area 135b do not correspond to the boundary between the source area 130b and the channel area 130a, conductorization diffusion into the channel area 130a may be avoided or controlled. Likewise, even when the first drain conductorization control area 136a and the second drain conductorization control area 136b do not correspond to the boundary between the drain area 130c and the channel area 130a, conductorization diffusion into the channel area 130a may be avoided or controlled FIG. 14 is a plan view illustrating a thin film transistor 1200 according to further still another embodiment of the present disclosure.

Figure 14:
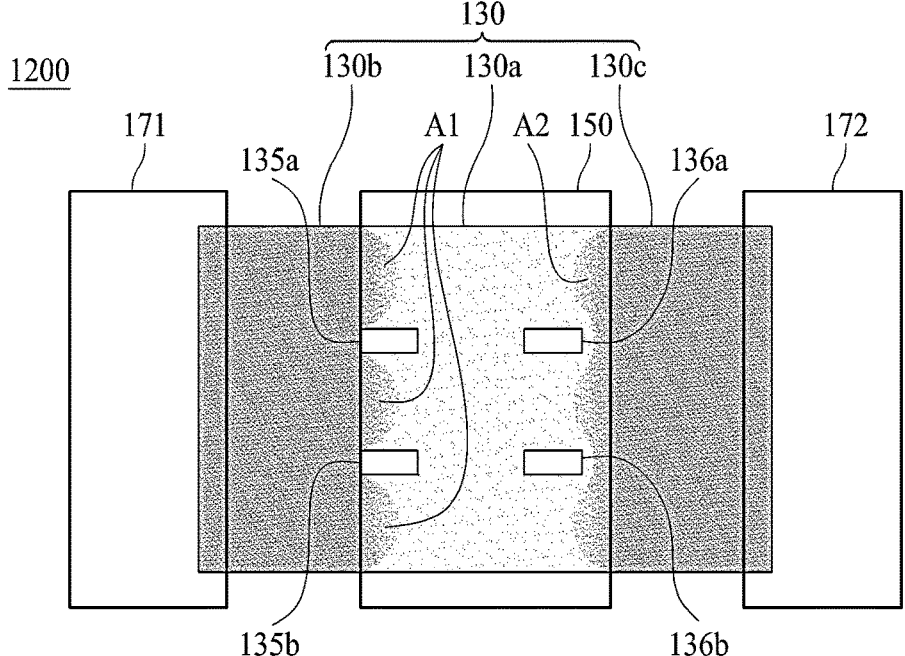
FIG. 14 is a plan view illustrating a thin film transistor according to further still another embodiment of the present disclosure.

In FIG. 14 as compared with FIG. 13, the first source conductorization control area 135a and the second source conductorization control area 135b correspond to the boundary between the source area 130b and the channel area 130a and do not correspond to the source area 130b, but one embodiment of the present disclosure is not limited thereto. Only the first drain conductorization control area 136a and the second drain conductorization control area 136b may correspond to the boundary between the drain area 130c and the channel area 130a and may not correspond to the drain area 130c. Even in this case, conductorization diffusion into the channel area 130a may be controlled or avoided.

Figure 15:
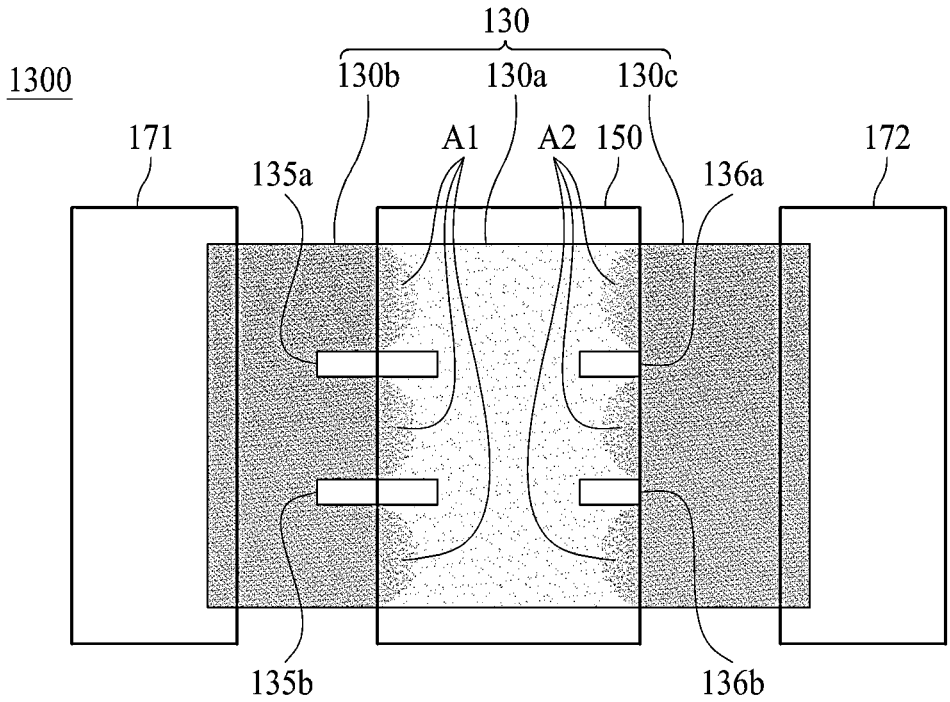
FIG. 15 is a plan view illustrating a thin film transistor according to further still another embodiment of the present disclosure.

FIG. 15 is a plan view illustrating a thin film transistor 1300 according to further still another embodiment of the present disclosure.

In FIG. 15 as compared with FIG. 13, the first source conductorization control area 135a and the second source conductorization control area 135b correspond to the source area 130b, but one embodiment of the present disclosure is not limited thereto. Only the first drain conductorization control area 136a and the second drain conductorization control area 136b may correspond to the drain area 130c. In any case, conductorization diffusion into the channel area 130a may be controlled or avoided.

Figure 16A:
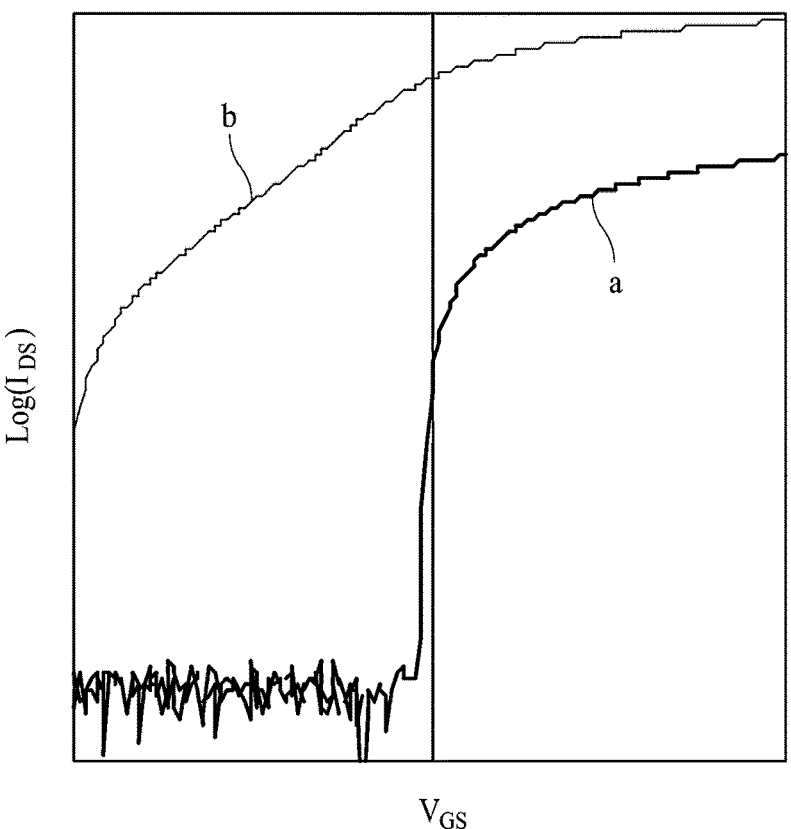
FIG. 16A is a graph illustrating threshold voltages of thin film transistors according to Embodiment and Comparative Example.

FIG. 16A is a graph illustrating threshold voltages Vth of thin film transistors according to Embodiment and Comparative Example.

Figure 16B:
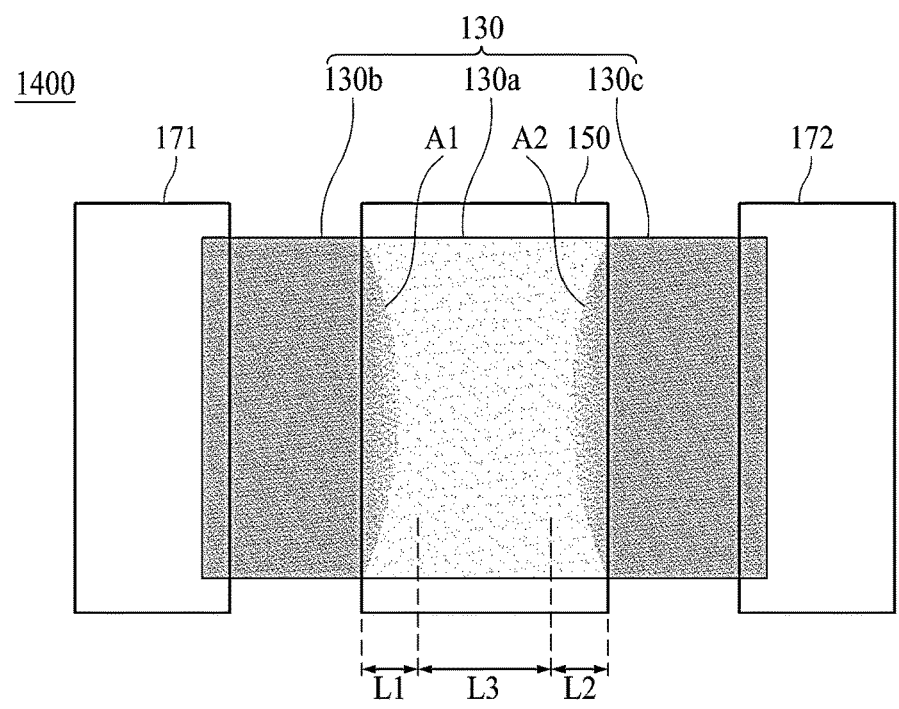
FIG. 16B is a plan view illustrating a thin film transistor according to Comparative Example of FIG. 16A.

FIG. 16B is a plan view illustrating a thin film transistor according to the Comparative Example of FIG. 16A.

In FIG. 16A, a graph 'a' is a result of measuring a threshold voltage Vth of the thin film transistor according to the embodiment, and a graph 'b' is a result of measuring the threshold voltage Vth of the thin film transistor according to the comparative example.

In the graph of FIG. 16A, a horizontal axis refers to a gate voltage VG, and a vertical axis refers to a log value of a drain-source current IDS.

The thin film transistor according to the embodiment includes a first source conductorization control area 135a and a first drain conductorization control area 136a. On the other hand, the thin film transistor according to the comparative example does not include a first source conductorization control area 135a and a first drain conductorization control area 136a (see FIG. 16B). The thin film transistor according to the embodiment may further include a second source conductorization control area 135b and a second drain conductorization control area 136b.

In case of the embodiment that includes the first source conductorization control area 135a and the first drain conductorization control area 136a, conductorization permeation may be avoided or controlled at the boundary between the channel area 130a and the source area 130b and the boundary between the channel area 130a and the drain area 130c. As a result, even when the channel area 130a of the active layer 130 has a large channel width W, the channel width W of the area in which conductorization is performed becomes narrow, so that conductorization may be suppressed or controlled in the channel area 130a.

Therefore, when conductorization in the channel area 130a is suppressed or controlled, the conductorization permeation depth ΔL becomes shorter, so that a relatively large effective channel length is obtained. In addition, when conductorization in the channel area 130a is suppressed or controlled, shift of the threshold voltage Vth of the thin film transistor in the negative (−) direction may be controlled, so that driving stability of the thin film transistor may be improved.

With reference to FIG. 16B, in case of the comparative example that does not include the first source conductorization control area 135a and the first drain conductorization control area 136a, conductorization may be performed at the boundary between the channel area 130a and the source area 130b and the boundary between the channel area 130a and the drain area 130c.

Therefore, when conductorization in the channel area 130a is performed, the length of the conductorization permeation depth ΔL is lengthened, so that a relatively short effective channel length is obtained. In addition, when conductorization is performed in the channel area 130a, the threshold voltage Vth of the thin film transistor may be shifted in the negative (−) direction, so that driving stability of the thin film transistor may be deteriorated.

When the thin film transistor according to one embodiment of the present disclosure, which comprises an active layer 130 that includes a first source conductorization control area 135a and a first drain conductorization control area 136a, is compared with the thin film transistor according to the comparative example of the present disclosure, which comprises an active layer 130 that does not include a first source conductorization control area 135a and a first drain conductorization control area 136a, it is noted that the threshold voltage Vth of the thin film transistor according to the comparative example of the present disclosure is shifted in the negative (−) direction in case of the same ON-current.

Figure 17:
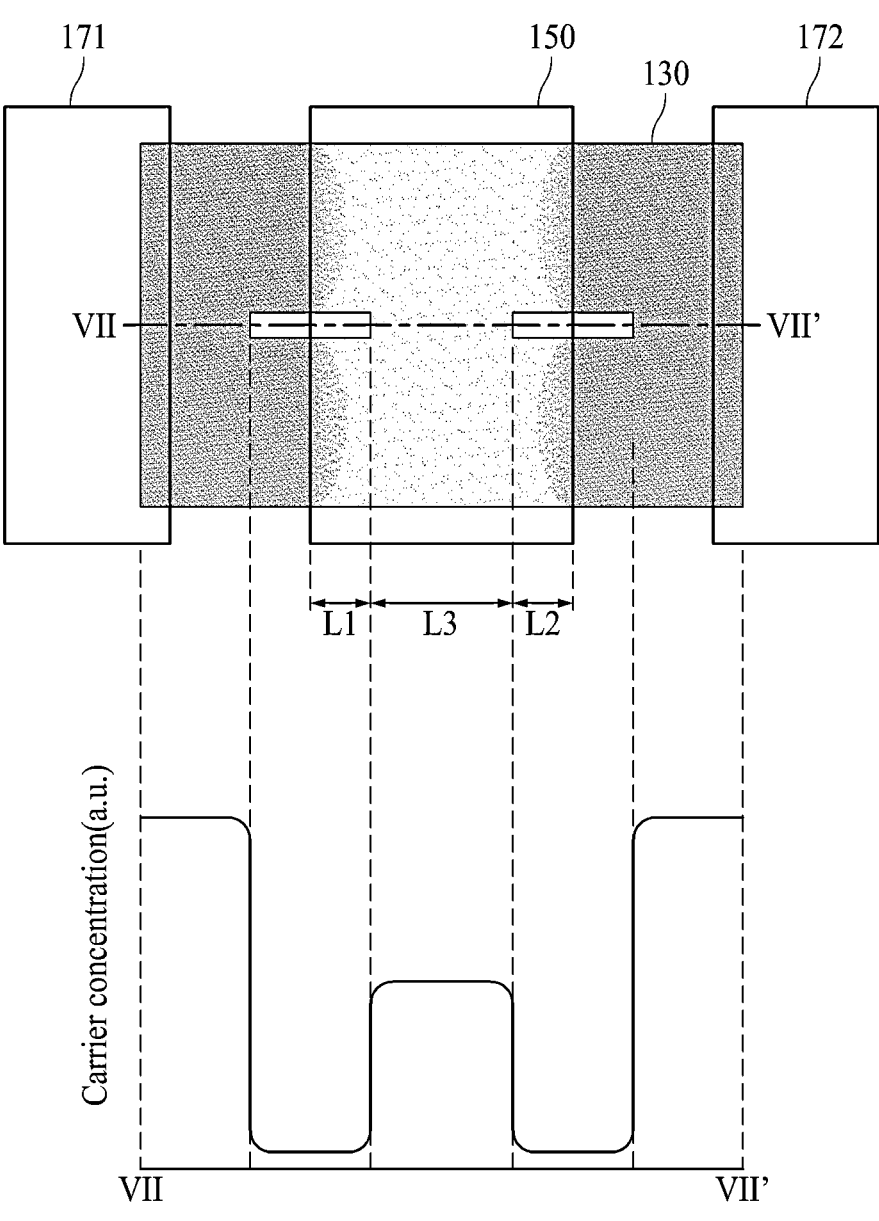
FIG. 17 is a graph illustrating a carrier concentration for each area of an active layer.

FIG. 17 is a graph illustrating a carrier concentration for each area of an active layer 130. For example, FIG. 17 is a graph illustrating a carrier concentration according to VIII-VIII' of the active layer 130. In this case, the active layer 130 may be made of an oxide semiconductor material.

A horizontal axis in the graph of FIG. 17 sequentially denotes the source area 130b, the channel area 130a and the drain area 130c, the first source conductorization control area 135a corresponds to the source area 130b and the channel area 130a, and the first drain conductorization control area 136a corresponds to the channel area 130a and the drain area 130c. The horizontal axis of FIG. 17 may correspond to a distance measured from a left end of the active layer 130 shown in FIG. 17. A vertical axis in the graph of FIG. 17 denotes a carrier concentration (a.u.).

Referring to FIG. 17, the first active layer 131 may not be stacked or its thickness may be small on the first source conductorization control area 135a and the first drain conductorization control area 136a. As a result, there is almost no concentration of a dopant in the first source conductorization control area 135a and the first drain conductorization control area 136a, or the concentration of the dopant may be low. Therefore, the carrier concentration of the first source conductorization control area 135a and the first drain conductorization control area 136a may be absent or very low. On the other hand, the thickness of the first active layer 131 disposed in the channel area 130a except the first source conductorization control area 135a and the first drain conductorization control area 136a is greater than that of the first active layer 131 disposed in the first source conductorization control area 135a and the first drain conductorization control area 136a, whereby the carrier concentration of the channel area 130a except the first source conductorization control area 135a and the first drain conductorization control area 136a is greater than the carrier concentration of the first source conductorization control area 135a and the first drain conductorization control area 136a. The source area 130b and the drain area 130c are the areas formed by conductorization, and have a high carrier concentration.

Figure 18:
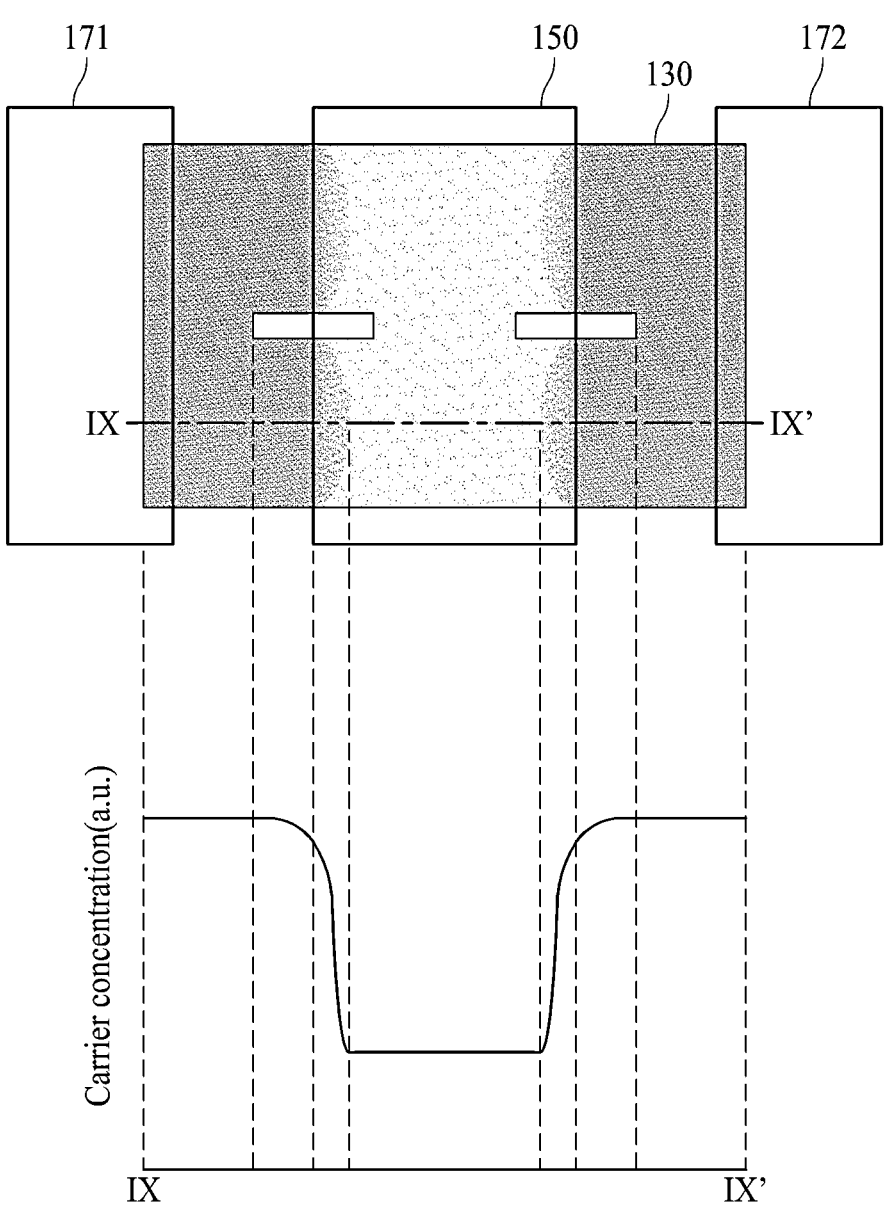
FIG. 18 is a graph illustrating a carrier concentration for each area of an active layer.

FIG. 18 is a graph illustrating a carrier concentration for each area of an active layer 130. For example, FIG. 18 is a graph illustrating a carrier concentration according to IX-IX' of the active layer 130. In this case, the active layer 130 may be made of an oxide semiconductor material.

A vertical axis in the graph of FIG. 18 is the same as that of FIG. 17 and thus its description will be omitted.

A horizontal axis in the graph of FIG. 18 sequentially denotes the source area 130b, the channel area 130a and the drain area 130c, and the channel area 130a includes a first diffusion area A1 and a second diffusion area A2. The horizontal axis of FIG. 18 may correspond to a distance measured from a left end of the active layer 130 shown in FIG. 18.

Referring to FIG. 18, the channel area 130a except the first source conductorization control area 135a and the first drain conductorization control area 136a has a high carrier concentration, and the source area 130b and the drain area 130c are the areas formed by conductorization, and have a high carrier concentration. In addition, a carrier concentration gradient is formed in the first diffusion area A1 and the second diffusion area A2.

According to one embodiment of the present disclosure, the first diffusion area A1 has a carrier concentration gradient such that the carrier concentration is reduced (in other words, decreases) along a direction away from the source area 130b. For example, referring to the graph of FIG. 18, the carrier concentration is the highest in the source area 130b, the carrier concentration of the first diffusion area A1 is gradually reduced as the first diffusion area A1 becomes far away from the source area 130b, and the carrier concentration is the lowest in the area of the channel area 130a, which excludes the first diffusion area A1 and the second diffusion area A2.

According to one embodiment of the present disclosure, the second diffusion area A2 has a carrier concentration gradient such that the carrier concentration is reduced (in other words, decreases) along a direction away from the drain area 130c. For example, referring to the graph of FIG. 18, the carrier concentration is the highest in the drain area 130c, the carrier concentration of the second diffusion area A2 is gradually reduced as the second diffusion area A2 becomes far away from the drain area 130c, and the carrier concentration is the lowest in the area of the channel area 130a, which excludes the first diffusion area A1 and the second diffusion area A2.

Figure 19:
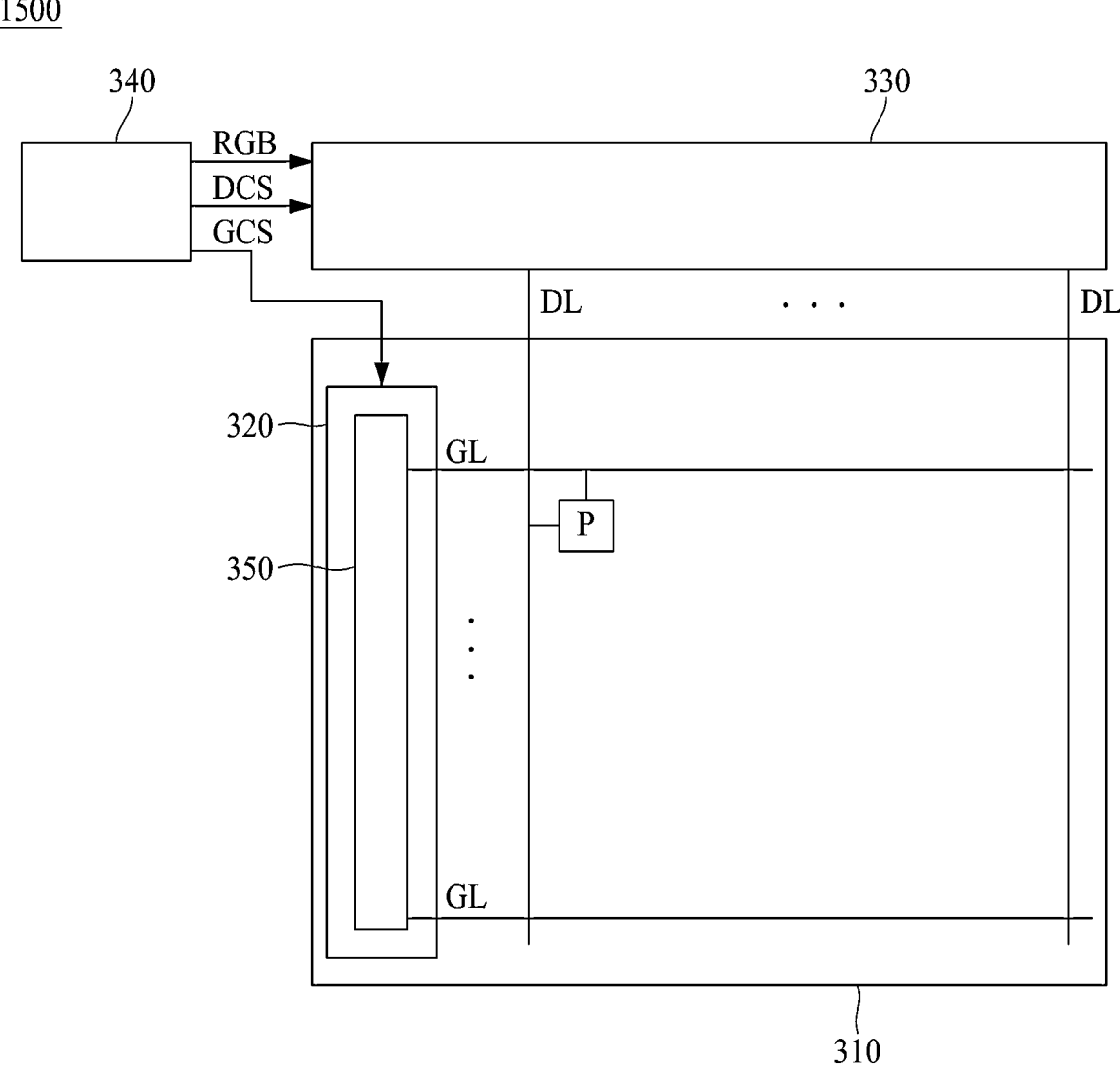
FIG. 19 is a schematic view illustrating a display apparatus according to one embodiment of the present disclosure.

FIG. 19 is a schematic view illustrating a display apparatus 1500 according to further still another embodiment of the present disclosure.

As shown in FIG. 19, the display apparatus 1500 according to further still another embodiment of the present disclosure may include a display panel 310, a gate driver 320, a data driver 330 and a controller 340.

The display panel 310 includes gate lines GL and data lines DL, and pixels P are disposed in intersection areas of the gate lines GL and the data lines DL. An image is displayed by driving of the pixels P. The gate lines GL, the data lines DL and the pixels P may be disposed on the base substrate 110.

The controller 340 controls the gate driver 320 and the data driver 330. The controller 340 outputs a gate control signal GCS for controlling the gate driver 320 and a data control signal DCS for controlling the data driver 330 by using a signal supplied from an external system not shown. Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. For example, the data driver 330 converts the image data RGB input from the controller 340 into an analog data voltage and supplies the data voltage to the data lines DL.

According to one embodiment of the present disclosure, the gate driver 320 may be packaged on the display panel 310. In this way, a structure in which the gate driver 320 is directly packaged on the display panel 310 will be referred to as a Gate In Panel (GIP) structure. For example, in the Gate In Panel (GIP) structure, the gate driver 320 may be disposed on the base substrate 110.

The display apparatus 1500 according to one embodiment of the present disclosure may include the above-described thin film transistors 100, 200, 300, 400, 500, 600, 700, 800, 900, 1000, 1100, 1200 and 1300. According to one embodiment of the present disclosure, the gate driver 320 may include the above-described thin film transistors 100, 200, 300, 400, 500, 600, 700, 800, 900, 1000, 1100, 1200 and 1300.

The gate driver 320 may include a shift register 350. The shift register 350 sequentially supplies gate pulses to the gate lines GL for one frame by using the start signal and the gate clock, which are transmitted from the controller 340. In this case, one frame means a time period at which one image is output through the display panel 310. The gate pulse has a turn-on voltage capable of turning on a switching device (thin film transistor) disposed in the pixel P.

Also, the shift register 350 supplies a gate-off signal capable of turning off the switching device, to the gate line GL for the other period of one frame, at which the gate pulse is not supplied. Hereinafter, the gate pulse and the gate-off signal will be collectively referred to as a scan signal SS or Scan. The shift register 350 may include the above-described thin film transistors 100, 200, 300, 400, 500, 600, 700, 800, 900, 1000, 1100, 1200 and 1300.

Figure 20:
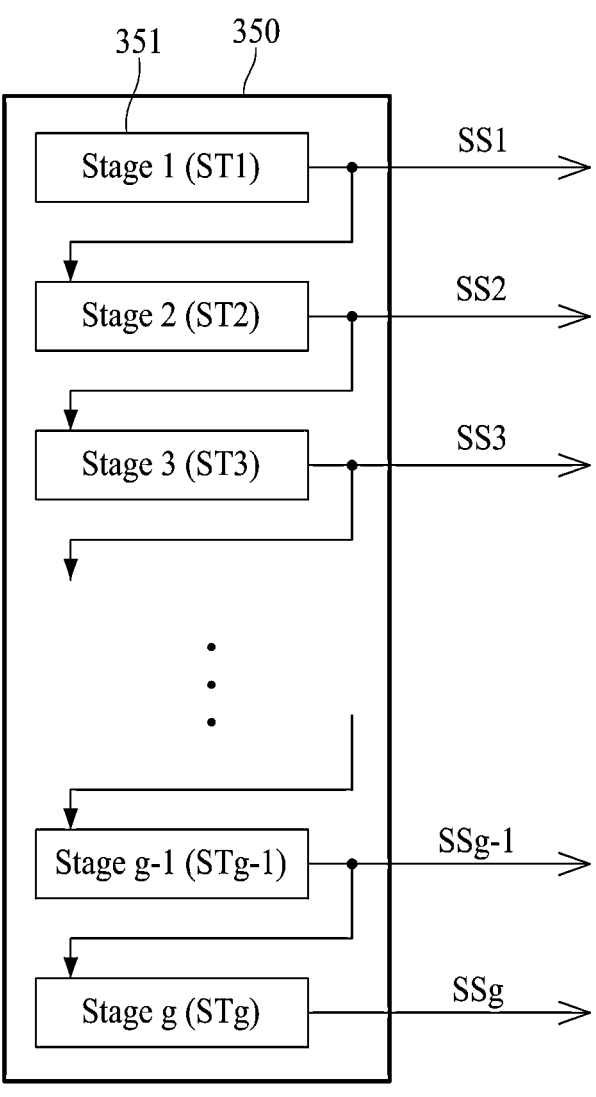
FIG. 20 is a schematic view illustrating a shift register.

FIG. 20 is a schematic view illustrating a shift register 350.

As shown in FIG. 20, the shift register 350 may include g number of stages 351 (ST1 to STg).

The shift register 350 transmits one scan signal SS to pixels P connected to one gate line GL through one gate line GL. Each of the stages 351 may be connected to one gate line GL. When g number of gate lines GL are formed in the display panel 110, the shift register 350 may include g number of stages 351 (ST1 to STg), and may generate g number of scan signals SS1 to SSg.

In general, each stage 351 outputs the gate pulse GP once during one frame, and the gate pulses GP are sequentially output from each stage 351.

Figure 21:
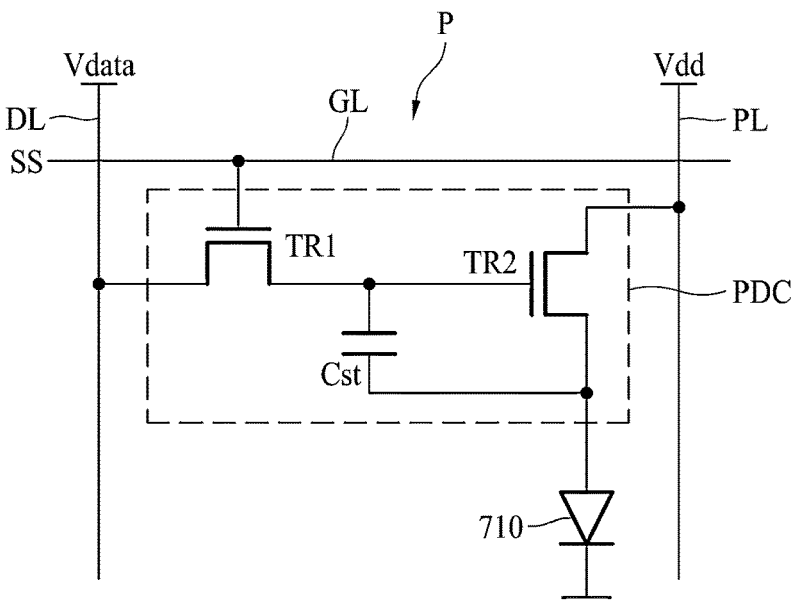
FIG. 21 is a circuit view illustrating any one pixel of FIG. 19.

FIG. 21 is a circuit view illustrating any one pixel P of FIG. 19.

The circuit view of FIG. 21 is an equivalent circuit view for the pixel P of the display apparatus 1500 that includes an organic light emitting diode (OLED) as a display device 710.

Referring to FIG. 21, the pixel P includes a display device 710 and a pixel driving circuit PDC for driving the display device 710. For example, the display apparatus 1500 according to one embodiment of the present disclosure may include a pixel driving circuit PDC on the base substrate 110.

The pixel driving circuit PDC of FIG. 21 includes a first thin film transistor TR1 that is a switching transistor and a second thin film transistor TR2 that is a driving transistor. The display apparatus 1500 according to another embodiment of the present disclosure may include at least one of the above-described thin film transistors 100, 200, 300, 400, 500, 600, 700, 800, 900, 1000, 1100, 1200 or 1300.

The first thin film transistor TR1 is connected to the gate line GL and the data line DL, and is turned on or off by the scan signal SS supplied through the gate line GL. The data line DL provides a data voltage Vdata to the pixel driving circuit PDC, and the first thin film transistor TR1 controls applying of the data voltage Vdata.

The driving power line PL provides a driving voltage Vdd to the display device 710, and the first thin film transistor TR1 controls the driving voltage Vdd. The driving voltage Vdd is a pixel driving voltage for driving the organic light emitting diode (OLED) that is the display device 710.

When the second thin film transistor TR2 is turned on by the scan signal SS applied from the gate driver 320 through the gate line GL, the data voltage Vdata supplied through the data line DL is supplied to a gate electrode of the second thin film transistor TR2 connected to the display device 710. The data voltage Vdata is charged in a storage capacitor Cst formed between the gate electrode and a source electrode of the second thin film transistor TR2.

The amount of a current supplied to the organic light emitting diode (OLED), which is the display device 710, through the second thin film transistor TR2 is controlled in accordance with the data voltage Vdata, whereby a gray scale of light output from the display device 710 may be controlled.

Figure 22:
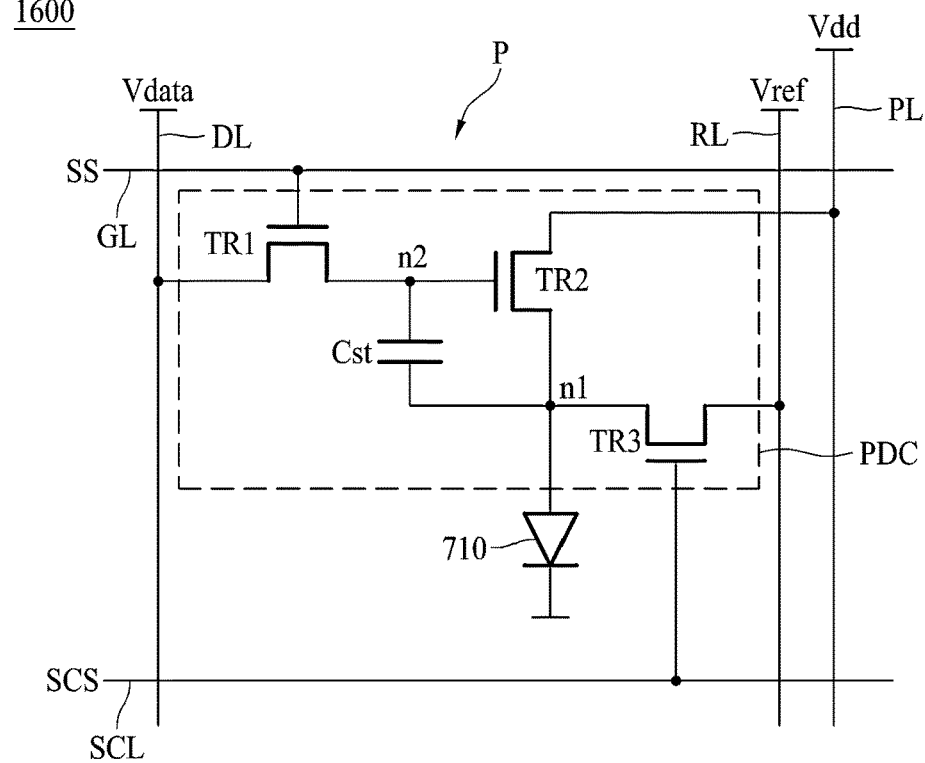
FIG. 22 is a circuit view illustrating any one pixel of a display apparatus according to another embodiment of the present disclosure.

FIG. 22 is a circuit view illustrating any one pixel P of a display apparatus 1600 according to another embodiment of the present disclosure.

FIG. 22 is an equivalent circuit view for the pixel P of an organic light emitting display apparatus. The pixel P of the display apparatus 1600 shown in FIG. 22 includes an organic light emitting diode (OLED) that is a display device 710 and a pixel driving circuit PDC for driving the display device 710. The display device 710 is connected with the pixel driving circuit PDC. In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display device 710 in accordance with the data voltage Vdata transmitted through the first thin film transistor TR1, and a third thin film transistor TR3 (sensing transistor) for sensing characteristics of the second thin film transistor TR2.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to a first node n1 between the second thin film transistor TR2 and the display device 710 and the reference line RL, and thus is turned on or off by the sensing control signal SCS and senses characteristics of the second thin film transistor TR2, which is a driving transistor, for a sensing period.

A second node n2 connected with the gate electrode of the second thin film transistor TR2 is connected with the first thin film transistor TR1. A storage capacitor Cst is formed between the second node n2 and the first node n1.

When the first thin film transistor TR1 is turned on, the data voltage Vdata supplied through the data line DL is supplied to the gate electrode of the second thin film transistor TR2. The data voltage Vdata is charged in the storage capacitor Cst formed between the gate electrode and the source electrode of the second thin film transistor TR2.

When the second thin film transistor TR2 is turned on, the current is supplied to the display device 710 through the second thin film transistor TR2 in accordance with the driving voltage Vdd for driving the pixel, whereby light is output from the display device 710.

The display apparatus 1600 according to another embodiment of the present disclosure may include at least one of the above-described thin film transistors 100, 200, 300, 400, 500, 600, 700, 800, 900, 1000, 1100, 1200 or 1300.

Figure 23:
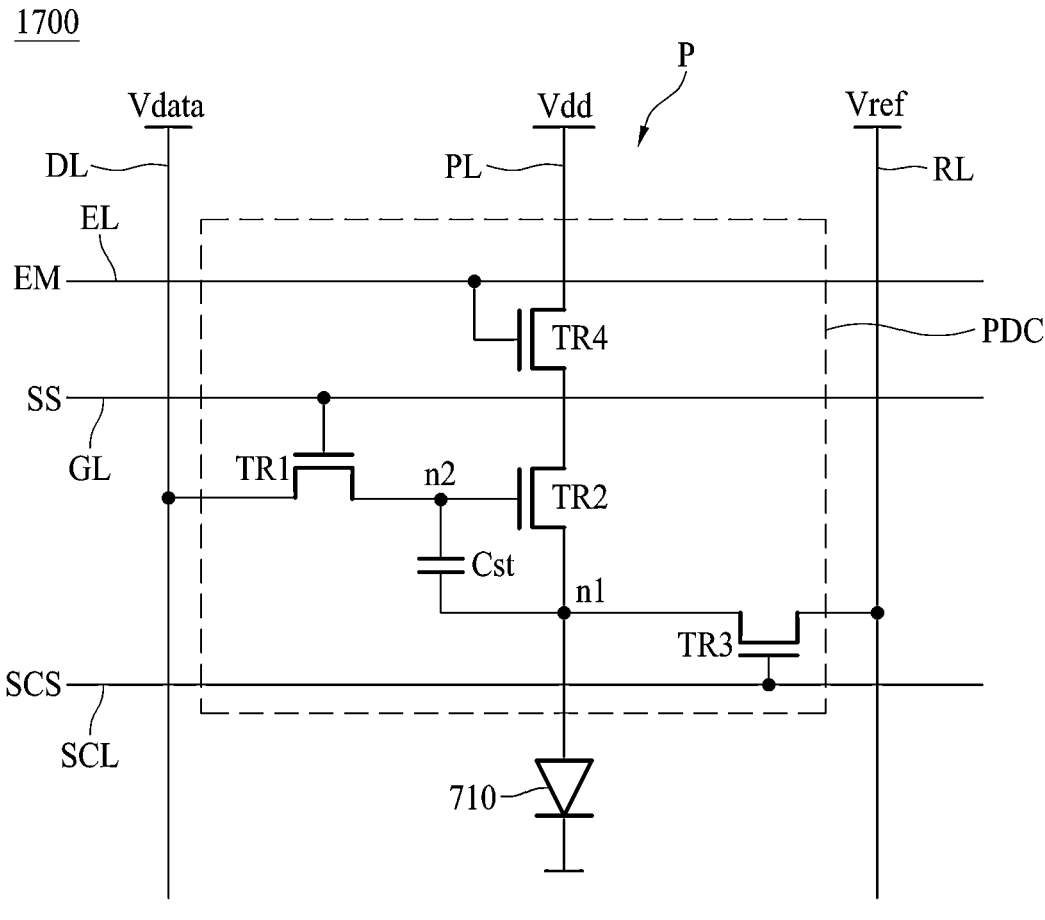
FIG. 23 is a circuit view illustrating any one pixel of a display apparatus according to still another embodiment of the present disclosure.

FIG. 23 is a circuit view illustrating any one pixel P of a display apparatus 1700 according to still another embodiment of the present disclosure.

The pixel P of the display apparatus 1700 shown in FIG. 23 includes an organic light emitting diode (OLED) that is a display device 710 and a pixel driving circuit PDC for driving the display device 710. The display device 710 is connected with the pixel driving circuit PDC.

The pixel driving circuit PDC includes thin film transistors TR1, TR2, TR3 and TR4. In the pixel P, signal lines DL, EL, GL, PL, SCL and RL for supplying a driving signal to the pixel driving circuit PDC are disposed.

In comparison with the pixel P of FIG. 22, the pixel P of FIG. 23 further includes an emission control line EL. An emission control signal EM is supplied to the emission control line EL. Also, the pixel driving circuit PDC of FIG. 23 further includes a fourth thin film transistor TR4 that is an emission control transistor for controlling a light emission timing of the second thin film transistor TR2, in comparison with the pixel driving circuit PDC of FIG. 22. The first thin film transistor TR1 is turned on by the scan signal SS supplied to the gate line GL to transmit the data voltage Vdata, which is supplied to the data line DL, to the gate electrode of the second thin film transistor TR2.

A storage capacitor Cst is positioned between the gate electrode of the second thin film transistor TR2 and the display device 710.

The third thin film transistor TR3 is connected to the reference line RL, and thus is turned on or off by the sensing control signal SCS and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display device 710.

The pixel driving circuit PDC according to still another embodiment of the present disclosure may be formed in various structures in addition to the above-described structure. The pixel driving circuit PDC may include, for example, five or more thin film transistors.

According to the present disclosure, the following advantageous effects may be obtained.

In the thin film transistor according to one embodiment of the present disclosure, the active layer includes a pattern so that the conductorization permeation depth may be controlled even though a channel area has a large width.

In the thin film transistor according to one embodiment of the present disclosure, the active layer includes a pattern so that the threshold voltage Vth may be prevented from being shifted in a negative (–) direction even though a channel area has a large width.

In the thin film transistor according to one embodiment of the present disclosure, the active layer includes a pattern so that stability and excellent reliability may be provided.

It will be apparent to those skilled in the art that various modifications and variations can be made in the thin film transistor and the display apparatus comprising the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A thin film transistor, comprising:
an active layer; and
a gate electrode spaced apart from the active layer to at least partially overlap the active layer in a plan view,
wherein the active layer includes:
a channel area that is overlapped by the gate electrode in the plan view;
a source area connected to one side of the channel area without being overlapped by the gate electrode in the plan view; and
a drain area connected to another side of the channel area without being overlapped by the gate electrode in the plan view,
wherein the source area and the drain area are spaced apart from each other with the channel area interposed therebetween,
wherein the active layer includes a first source conductorization control area and a first drain conductorization control area, which are spaced apart from each other,
wherein the first source conductorization control area corresponds to at least a portion of the channel area in the plan view,
wherein the first drain conductorization control area corresponds to at least a portion of the channel area in the plan view,
wherein the active layer includes a first active layer,
wherein the first active layer is in at least a portion of the channel area, at least a portion of the source area, and at least a portion of the drain area, and
wherein the first active layer in the first source conductorization control area has a thickness smaller than that of the first active layer in the channel area except the first source conductorization control area and the first drain conductorization control area.

2. The thin film transistor of claim 1, wherein the first drain conductorization control area is on a first line that is a shortest line connecting the source area with the drain area across the first source conductorization control area.

3. The thin film transistor of claim 1, wherein the active layer is absent at least at a portion of the first source conductorization control area and the first drain conductorization control area.

4. The thin film transistor of claim 1, wherein the first active layer is absent at least at a portion of the first source conductorization control area and the first drain conductorization control area.

5. The thin film transistor of claim 1, wherein the active layer further includes a second active layer on the first active layer.

6. The thin film transistor of claim 5, wherein the second active layer is in the entire channel area, the entire source area, and the entire drain area.

7. The thin film transistor of claim 5, wherein the second active layer is in the first source conductorization control area and the first drain conductorization control area.

8. The thin film transistor of claim 7, wherein at least a portion of the second active layer is in contact with a side of the first active layer in the first source conductorization control area and the first drain conductorization control area.

9. The thin film transistor of claim 5, wherein the second active layer includes a third oxide semiconductor layer and a fourth oxide semiconductor layer on the third oxide semiconductor layer.

10. The thin film transistor of claim 9, wherein at least a portion of the first active layer is in contact with at least a portion of the third oxide semiconductor layer in the first source conductorization control area and the first drain conductorization control area.

11. The thin film transistor of claim 1, wherein the first active layer includes a first oxide semiconductor layer and a second oxide semiconductor layer on the first oxide semiconductor layer.

12. The thin film transistor of claim 11, wherein the active layer further includes a second active layer on the first active layer, and
wherein at least a portion of the second active layer is in contact with at least one of the first oxide semiconductor layer and the second oxide semiconductor layer in the first source conductorization control area and the first drain conductorization control area.

13. The thin film transistor of claim 1, wherein, in the plan view, the first source conductorization control area is disposed in the channel area to a boundary between the channel area and the source area, and the first source conductorization control area does not extend into the source area.

14. The thin film transistor of claim 1, wherein, in the plan view, the first drain conductorization control area is disposed in the channel area to a boundary between the channel area and the drain area, and the first drain conductorization control area does not extend into the drain area.

15. The thin film transistor of claim 1, wherein, in the plan view, the first source conductorization control area is in the channel area and in the source area to extend across a boundary between the channel area and the source area.

16. The thin film transistor of claim 15, wherein the first source conductorization control area extends 0.5 μm to 5 μm into the source area.

17. The thin film transistor of claim 1, wherein, in the plan view, the first drain conductorization control area is in the channel area and in the drain area to extend across a boundary between the channel area and the drain area.

18. The thin film transistor of claim 17, wherein the first drain conductorization control area extends 0.5 µm to 5 µm into the drain area.

19. The thin film transistor of claim 1, wherein, in the plan view, the first source conductorization control area does not extend across a boundary between the channel area and the source area.

20. The thin film transistor of claim 19, wherein a shortest distance between the first source conductorization control area and the boundary between the channel area and the source area ranges from 0.5 µm to 1.5 µm.

21. The thin film transistor of claim 1, wherein, in the plan view, the first drain conductorization control area does not extend across a boundary between the channel area and the drain area.

22. The thin film transistor of claim 21, wherein a shortest distance between the first drain conductorization control area and the boundary between the channel area and the drain area ranges from 0.5 µm to 1.5 µm.

23. The thin film transistor of claim 1, wherein the active layer includes a second source conductorization control area and a second drain conductorization control area, which are spaced apart from each other, wherein the second source conductorization control area corresponds to at least a portion of the channel area in the plan view, and wherein the second drain conductorization control area corresponds to at least a portion of the channel area in the plan view.

24. The thin film transistor of claim 23, wherein the first source conductorization control area and the second source conductorization control area are spaced apart from each other, and wherein the first drain conductorization control area and the second drain conductorization control area are spaced apart from each other.

25. The thin film transistor of claim 24, wherein the first source conductorization control area and the second source conductorization control area are disposed at intervals of 0.5 µm to 20 µm.

26. The thin film transistor of claim 24, wherein the first drain conductorization control area and the second drain conductorization control area are disposed at intervals of 0.5 µm to 20 µm.

27. The thin film transistor of claim 23, wherein, in the plan view, at least one of the first source conductorization control area or the second source conductorization control area is in the channel area and in the source area to extend across a boundary between the channel area and the source area.

28. The thin film transistor of claim 23, wherein, in the plan view, at least one of the first drain conductorization control area or the second drain conductorization control area is in the channel area and in the drain area to extend across a boundary between the channel area and the drain area.

29. The thin film transistor of claim 1, wherein the first source conductorization control area and the first drain conductorization control area each have a width and a length, and wherein the width ranges from 0.5 µm to 5 µm.

30. The thin film transistor of claim 1, wherein, a length of an area in which the first source conductorization control area and the gate electrode overlap each other ranges from 0.5 µm to 1.5 µm.

31. The thin film transistor of claim 1, wherein, a length of an area in which the first drain conductorization control area and the gate electrode overlap each other ranges from 0.5 µm to 1.5 µm.

32. The thin film transistor of claim 1, wherein the first source conductorization control area extends in a length direction to an edge of the channel area, and wherein the length direction of the channel area is a direction between the source area and the drain area.

33. The thin film transistor of claim 1, wherein the first drain conductorization control area extends in a length direction to an edge of the channel area, and wherein the length direction of the channel area is a direction between the source area and the drain area.

34. The thin film transistor of claim 1, wherein the channel area has a first diffusion area and a second diffusion area, which are spaced apart from each other, wherein the first diffusion area is in the channel area and is in contact with the source area, wherein the second diffusion area is in the channel area and is in contact with the drain area, wherein the first diffusion area and the second diffusion area do not extend into the first source conductorization control area and the first drain conductorization control area, and wherein the first diffusion area and the second diffusion area are partially conductorized.

35. The thin film transistor of claim 34, wherein the first diffusion area has a carrier concentration gradient that is reduced along a direction away from the source area, and wherein the second diffusion area has a carrier concentration gradient that is reduced along a direction away from the drain area.

36. A display apparatus comprising:

the thin film transistor of claim 1;

a pixel configured to emit light, the pixel being connected to the thin film transistor.

* * * * *